United States Patent
McMunigal et al.

(10) Patent No.: US 6,648,587 B1
(45) Date of Patent: Nov. 18, 2003

(54) MATERIAL DELIVERY SYSTEM FOR CLEAN ROOM-LIKE ENVIRONMENTS

(75) Inventors: Tom E. McMunigal, Mead, CO (US); Michael A. Finn, Longmont, CO (US); John D. McCrandall, Longmont, CO (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/801,379

(22) Filed: Mar. 7, 2001

Related U.S. Application Data

(63) Continuation-in-part of application No. 09/383,002, filed on Aug. 25, 1999, now Pat. No. 6,305,500.

(51) Int. Cl.$^7$ ............................................. B65G 60/00
(52) U.S. Cl. ............... 414/800; 414/793.8; 414/796.5; 414/796.7; 187/391; 187/394
(58) Field of Search ................. 187/391, 394; 414/796.7, 796.8, 793.8, 796.5, 800, 801, 811

(56) References Cited

U.S. PATENT DOCUMENTS

| | | | |
|---|---|---|---|
| 478,748 A | 7/1892 | Grosh | 49/278 |
| 1,878,687 A | 9/1932 | Fergusson | 220/285 |
| 2,631,032 A | 3/1953 | Denker et al. | 268/72 |
| 2,937,718 A | 5/1960 | Larson et al. | 187/24 |
| 3,752,240 A | 8/1973 | Binks et al. | 312/236 |
| 3,768,628 A | 10/1973 | Bross | 198/54 |
| 4,508,959 A | 4/1985 | Luscher | 219/385 |
| 4,557,656 A * | 12/1985 | Ouellette | 414/43 |
| 4,576,537 A * | 3/1986 | Inaba et al. | 414/222 |
| 4,732,522 A * | 3/1988 | Pence | 414/118 |
| 5,013,983 A * | 5/1991 | Futch et al. | 414/796.7 X |
| 5,135,351 A * | 8/1992 | Rathert | 414/789.5 |
| 5,256,028 A * | 10/1993 | Winski et al. | 414/786 |
| 5,344,365 A | 9/1994 | Scott et al. | 454/187 |
| 5,348,441 A * | 9/1994 | Takemasa et al. | 414/796.7 |
| 5,401,212 A | 3/1995 | Marvell et al. | 454/187 |
| 5,487,768 A | 1/1996 | Zytka et al. | 55/385.2 |
| 5,489,106 A | 2/1996 | Engelking et al. | 280/47.35 |
| 5,570,990 A | 11/1996 | Bonora et al. | 414/543 |
| 5,713,791 A | 2/1998 | Long et al. | 454/187 |
| 5,754,105 A | 5/1998 | Shibata | 340/540 |
| 5,807,064 A * | 9/1998 | Dudash | 414/790 |
| 5,882,174 A * | 3/1999 | Woerner et al. | 414/788.7 |
| 6,062,807 A * | 5/2000 | Johnson et al. | 414/795.8 |
| 6,070,731 A | 6/2000 | Kobayashi et al. | 206/722 |

FOREIGN PATENT DOCUMENTS

| | | | |
|---|---|---|---|
| JP | 444246 | * | 2/1992 |
| JP | 4215454 | * | 8/1992 |
| JP | 8241921 | * | 9/1996 |
| JP | 997824 | * | 4/1997 |
| JP | 09162262 A | | 6/1997 |
| JP | 1067326 | * | 3/1998 |
| JP | 10-74815 | | 3/1998 |
| JP | 10303274 | * | 11/1998 |
| JP | 200135901 | * | 2/2001 |

* cited by examiner

Primary Examiner—Steven A. Bratlie
(74) Attorney, Agent, or Firm—Marsh Fischmann & Breyfogle LLP

(57) ABSTRACT

A material delivery system is disclosed which is particularly useful for filtered environments, such as clean rooms, minienvironments, or the like. One aspect of this particular material delivery system is that movement of an elevator is automatically controlled (i.e., no operator input), and more preferably is accomplished by monitoring for the presence of containers at multiple vertical positions. Another aspect of this particular material delivery system is that its elevator may be installed on and removed from a main housing of the material delivery system without requiring any tools. Yet another aspect of this particular material delivery system is that containers need not be unloaded from the material delivery system prior to removing its elevator, such as for replacement/maintenance purposes.

30 Claims, 24 Drawing Sheets

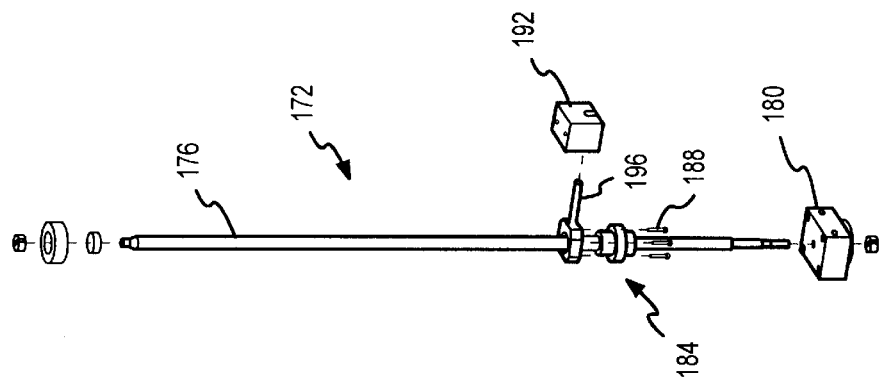
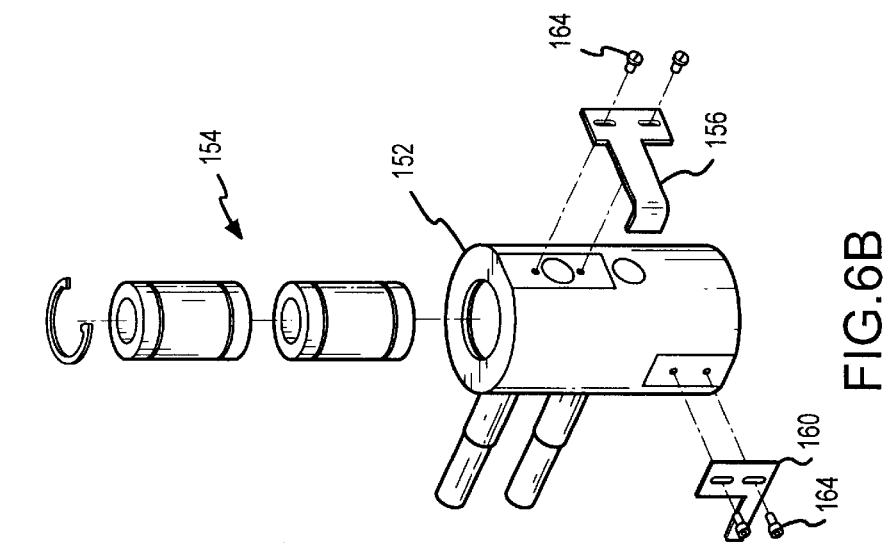
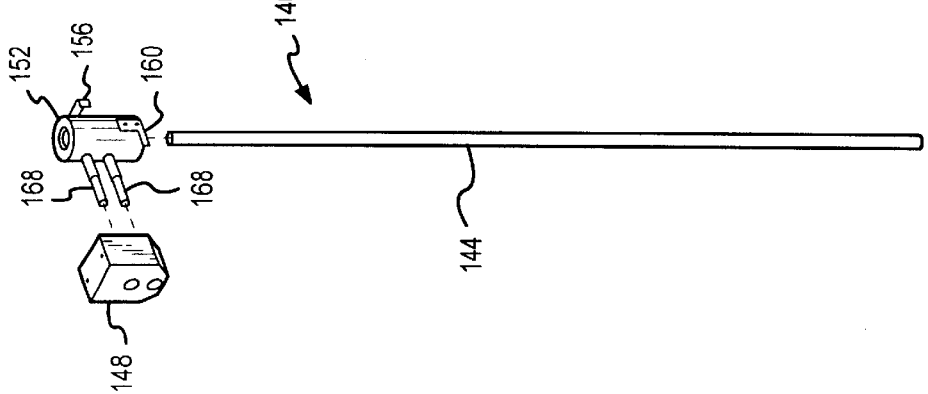

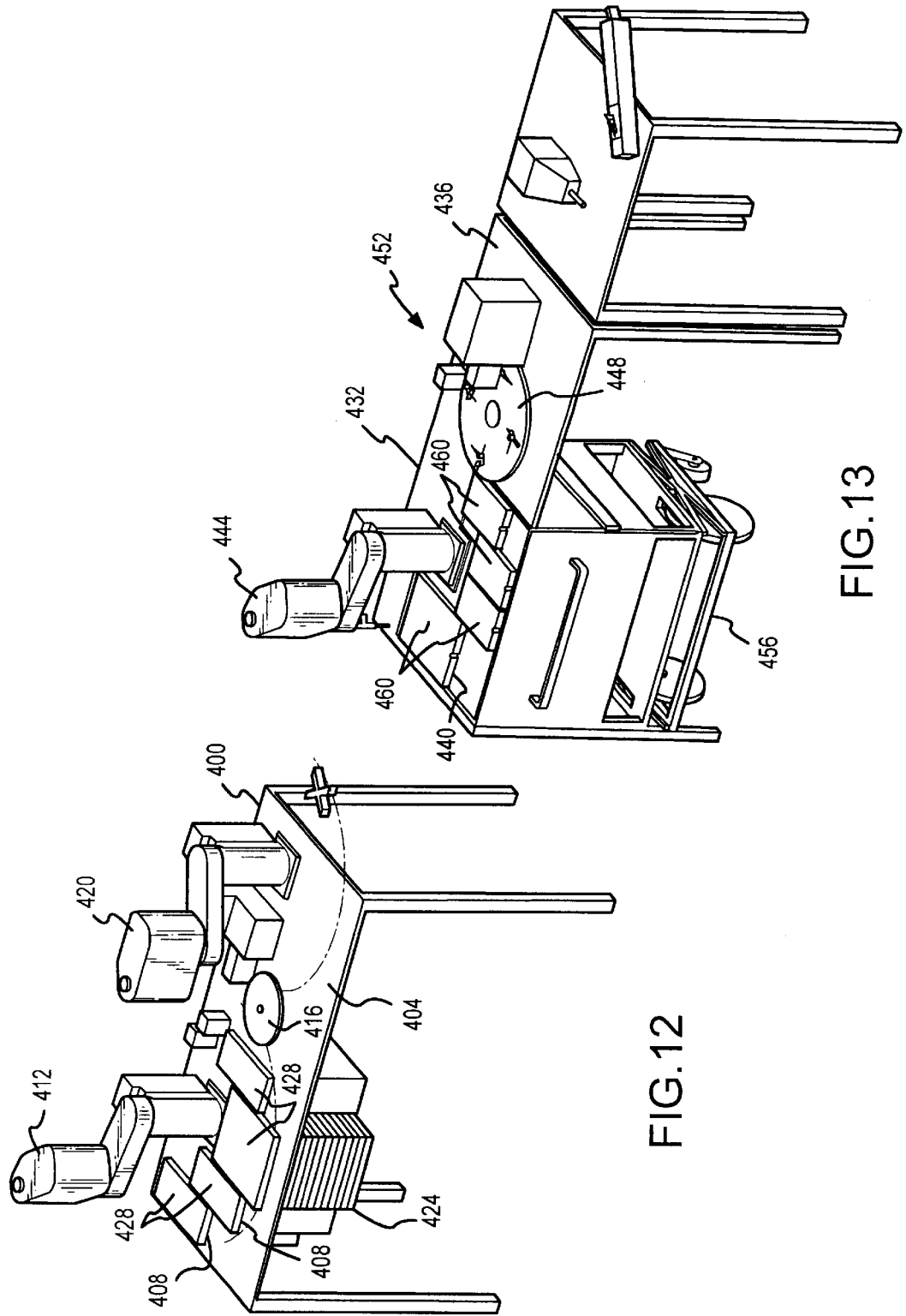

MATERIAL DELIVERY SYSTEM FOR CLEAN ROOM-LIKE ENVIRONMENTS

CROSS-REFERENCE TO RELATED APPLICATIONS

This application is a continuation-in-part of U.S. patent application Ser. No. 09/383,002, that was filed on Aug. 25, 1999, now U.S. Pat. No. 6,305,500 that is entitled "MATERIAL DELIVERY SYSTEM FOR CLEAN ROOM-LIKE ENVIRONMENTS," and the entire disclosure of which is incorporated by reference in its entirety herein.

STATEMENTS REGARDING FEDERALLY SPONSORED RESEARCH OR DEVELOPMENT

Not applicable.

FIELD OF THE INVENTION

The present invention generally relates to the field of clean room-like environments and, more particularly, to a material delivery system for such environments.

BACKGROUND OF THE INVENTION

Many manufacturing or assembly processes require an environment which is free of particulates or other contaminants to at least a certain degree. Clean rooms have long been used in the semiconductor industry for the processing of wafers from which semiconductor devices are formed. Other industries which have used clean rooms include computer disk drive manufacturers. Certain disk drive parts are manufactured in a clean room environment, while other parts are manufactured and then cleaned prior to entry into a clean room for incorporation into some type of an assembly within the clean room (e.g., an actuator arm assembly).

One alternative to clean rooms which has been used at least in the computer disk drive industry is a so-called minienvironment. Minienvironments effectively are a self-contained unit which may be disposed within or outside of a clean room and which provide clean room-like air qualities. A representative example of a minienvironment is disclosed in U.S. Pat. No. 5,487,768 to Zytka et al., which is owned by the assignee of this patent application, and which is incorporated by reference in its entirety herein. Generally, a minienvironment is an enclosure of sorts which has its own forced air system for delivering filtered air into the noted enclosure. Various types of access may be provided to the minienvironment and through which this air may be discharged along with any particulates or other contaminants contained therein. These accesses or fluid interconnections with the surrounding environment are typically disposed on a lower portion of the minienvironment, and the filtered air is typically introduced into the minienvironment in an upper portion thereof.

Smaller-sized openings may be provided in the minienvironment's enclosure to allow an operator to dispose his or her arms therethrough to retrieve parts and/or to execute some type of operation (e.g., assembly) within the minienvironment. Only the operator's hands and possibly a portion of the operator's arms need to meet certain cleanliness requirements with this type of minienvironment. It should be appreciated that these types of minienvironments thereby do not provide for total isolation from the surrounding environment, but instead rely on a higher air pressure within the minienvironment's enclosure to keep particulates and other contaminants which may exist in the surrounding environment from flowing into the minienvironment through the noted fluid interconnections. The above-noted reference to an "enclosures" for a minienvironment would thereby include a shroud, hood, or the like which does not provide for a total enclosure (e.g., a gap may exist along a lower portion of a sidewall of the minienvironment). Some minienvironments may include a glove box or the like to further maintain the cleanliness within the minienvironment and for the above-noted types of purposes. Still other minienvironments have no access for operations personnel during normal operations within the minienvironment, but instead rely on robotic devices within the minienvironment to perform the desired operation(s) therewithin. In both of these later instances, there may be a total isolation of the interior of the minienvironment from the surrounding environment.

There are rather significant costs associated with the operation of both clean rooms and minienvironments. Simply put, the various actions which are undertaken in order to maintain the desired level of cleanliness often come at a rather significant financial cost. Both personnel and all other materials (e.g., parts to be used in an assembly being executed in the clean room/minienvironment) which enter the clean room or the minienvironment must be within the desired cleanliness level. U.S. Pat. Nos. 5,713,791 and 5,344,365 both address rather extravagant systems/methods directed to the transfer of materials to/from/within a clean room environment. So-called "clean carts" have also been used to transfer materials from outside a clean room to a location therein. Known clean carts are simplistically a box with an access door on a side thereof (i.e., the top is non-removable in these units). Cleaned parts are loaded into this "box" through the access door. Filtered air is simultaneously blown into the "box" during loading through this access door as well. All intended discharges from within the "box" at this time are also through this same access door as there are no other designed perforations in the clean cart. Once the clean cart is loaded, the door is closed to seal the interior of the same and it may then be wheeled into the clean room. Typically these clean carts are parked next to a station which uses the parts contained therein in some manner.

Numerous disadvantages exist in relation to known clean carts. One is that these clean carts consume floor space which in some cases may be at a premium. Another is that the operator must manually retrieve parts from the clean cart and provide the same to the subject workstation. Often this involves certain repetitive motions which may subject the operator to injury over time. For instance, an operator positioned on a chair at a minienvironment may have to rotate 90° and bend over to access the parts contained within the clean cart, and thereafter rotate back to the minienvironment with the parts in hand (typically on a tray) to position them into the minienvironment. The alternative would be for the operator to get up and walk over to the clean cart which not only wastes valuable time, but possibly means positioning the clean cart at a location where there may be unanticipated impacts between the clean cart and personnel which would be undesirable in a number of respects.

SUMMARY OF THE INVENTION

The present invention generally relates to a material delivery system and, more particularly, to a material delivery system for use with a workstation in a "clean" or filtered environment, such as a clean room or a minienvironment. One particularly desirable application for the present invention is for use in the assembly of computer disk drives.

A first aspect of the present invention generally relates to controlling the movement of an elevator in a material delivery system of the above-described type. A plurality of containers (e.g., a tray having a plurality of disk drive components stored therein), may be loaded on the elevator, either directly or through one or more intermediate structures. The elevator may be moved to position one of the containers for removal in a desired manner at the work station where the material delivery system of the first aspect is incorporated. One way to accomplish this movement of the elevator is to monitor for the presence of a container at least at one vertical position, and then to use the information to move the elevator in a predetermined manner.

Various refinements exist of the features noted above in relation to the first aspect of the present invention. Further features may also be incorporated in the present invention as well. These refinements and additional features may exist individually or in any combination. The work station that incorporates the first aspect of the present invention may include a tabletop or other work surface, on which one or more processing/assembly operations are performed in the filtered environment. The material delivery system may incorporate a number of features to reduce the potential for affecting the cleanliness level in the filtered environment. For instance, the material delivery system may include an upper support that is disposed at least generally at the same elevation as the work surface of the work station which incorporates the material delivery system of the first aspect. This upper support would then include a cavity that is aligned with the elevator to allow the plurality of containers to be loaded on and removed from the elevator. Multiple perforations may be incorporated on this upper support of the material delivery system so as to not adversely affect the downwardly directed flow that is typically used in filtered environments to maintain desired cleanliness levels. A platform on which the containers are stacked also may include a plurality of perforations for this same reason.

Movement of the elevator is again controlled by monitoring for the presence of a container at least at one vertical position in the first aspect. Any appropriate sensor for detecting the presence/absence of a container may be used. That is, a movement of the elevator may be initiated based upon a determination that a container is disposed at a certain vertical position. Conversely, a movement of the elevator may be initiated based upon a determination that a container is not disposed at a certain vertical position. Therefore, the "presence" of a container in accordance with the subject first aspect includes both of these situations. The direction in which the elevator is moved may be based upon a determination as to whether a container is or is not disposed at a certain vertical position as well. Multiple sensors may also be used to control the movement of the elevator. One of these sensors may control the upward movement of the elevator, while the other of these sensors may control the downward movement of the elevator.

One way to control the movement of the elevator of the material delivery system in accordance with the first aspect of the present invention is to monitor for the presence of a container at two different vertical positions. Both of these vertical positions may be located beyond an upper end of the material delivery system through which containers are directed for unloading. The elevator also may be moved in opposite directions in response to whether a container has been detected at these two different vertical positions. That is, the presence or absence of a container at one of these vertical positions may result in a downward movement of the elevator, while the presence or absence of a container at the other of these vertical positions may result in an upward movement of the elevator. For example, assume that first and second vertical positions are monitored for the presence of a container, with the second vertical position being at a higher elevation than the first vertical position. The elevator may be directed to move in a downward direction if a container is detected at the second vertical position, while the elevator may be directed to move in an upward direction if no container is detected at the first vertical position.

Controlled movement of the elevator in accordance with the first aspect may also be used in loading and unloading the elevator. Consider the case where the material delivery system is "empty." Typically the elevator will be at its uppermost position in this case through its controlling logic. A first container may be placed on the elevator and may occupy the first vertical position. Since no container is disposed at the second vertical position, the elevator will not be driven in a downward direction. Since there is a container disposed at the first vertical position, the elevator will not be driven in an upward direction. That is, if a container is detected at the second vertical position, the elevator will move down one increment, while if a container is not detected at the first vertical position, the elevator will move up one increment. A second container may then be placed on top of the first container. A container in this case will be disposed at the second vertical position, namely the second container. Therefore, the elevator will be lowered one increment, such that the second container will now be located at the first vertical position. This loading protocol may continue until the material delivery system is fully loaded, or until the desired number of containers have been loaded. It should be appreciated that the containers need not be placed on the elevator one at a time. Multiple containers could be simultaneously loaded on the elevator. In this case, if a container is detected at the second vertical position, the elevator will move down one increment. If after this downward incremental movement a container is still detected at the second vertical position, the elevator will move down yet another increment. This will continue until no container is detected at the second vertical position, which will correspond with the material delivery system of the first aspect being in a fully loaded state.

Continuing with the above-noted example now in relation to unloading the material delivery system of the first aspect, the absence of a container in the first vertical position is controlling in relation to the movement of the elevator. Preferably the first vertical position corresponds with the elevator being positioned to dispose the "uppermost" container in the material delivery system at least at generally the same elevation as the work surface of the workstation that incorporates the material delivery system of the first aspect. In the above-noted example, the second container was stacked on top of the first container. Assume that the second container is disposed at the first vertical position such that the first container is disposed at a lower elevation or within the material delivery system. When the second container is removed from the elevator, there will no longer be any container disposed at the first vertical position. This will be detected and cause the elevator to move in an upward direction one vertical increment such that the first container will now be disposed at the first vertical position. This protocol will continue until the material delivery system has been completely unloaded Preferably, the first aspect somehow limits the extent of the upward travel of the elevator (e.g., so as to not attempt to move up one more increment after the last container has been removed from the material delivery system). For instance, the upper extreme of the elevator travel could at least generally correspond with the location of the elevator when a container thereon is at the first vertical position. Other options exist. For instance, the material delivery system could allow the elevator to proceed in an upward direction a certain amount after the last container was removed from the elevator through another sensor. This could be the "starting" position for the elevator in a loading procedure as well.

A second aspect of the present invention generally relates to a quick connect/disconnect feature for an elevator of a material delivery system The material delivery system generally includes a housing having an open upper end and a hollow interior. A first platform is disposed within the housing for supporting at least one and typically a plurality of containers. An elevator is interconnected with the housing in a manner so as to be able to raise the first platform for the removal of any containers stacked thereon at the workstation that incorporates the material delivery system of the second aspect. A desirable interconnection is established between the housing and the elevator which preferably does not require any tooling for either installation or removal. In this regard, a pair of mounting slots are provided on a pair of opposite sides of the housing of the material delivery system, and the elevator includes a mounting assembly that has a pair of mounting pins on a pair of opposite sides thereof. The mounting pins are removably received in the mounting slots on the housing to provide the desired type of interconnection.

Various refinements exist of the features noted above in relation to the second aspect of the present invention. Further features may also be incorporated in the second aspect of the present invention as well. These refinements and additional features may exist individually or in any combination. For instance, the mounting slots may be oriented such that gravity alone retains the mounting pins of the elevator within the slots. Each of the mounting slots may slope downwardly at an angle such that the corresponding mounting pin will be disposed at the lowermost extreme of its corresponding mounting slot. One way for introducing the mounting pins into their corresponding mounting slot is to contour each slot to first extend at least generally upwardly, and then downwardly therefrom. In this case, the mounting pins on the elevator would first be aligned with their corresponding mounting slot, then moved in an at least generally upward direction, and then moved in an at least generally downward and lateral direction to complete the interconnection of the elevator to the housing.

A third aspect of the present invention generally relates to allowing an elevator of a material delivery system to be replaced without having to unload any containers from the material delivery system. In this regard, the material delivery system includes a housing having an open upper end through which containers may be removed from the hollow interior of the housing. A platform support exists somewhere within the hollow interior of the housing. The platform support may be part of the housing or separately attached thereto, but nonetheless allows for the passage of containers therethrough via movement of an elevator. A container platform may be disposed on this platform support, and a plurality of containers may be stacked on this container platform. An elevator platform travels through the hollow interior of the housing and may engage the lower extreme of the container platform to move the container platform in an at least generally upward direction to present one or more containers at a desired elevation (e.g., at least generally coplanar with a work surface of a work station that incorporates the third aspect). Therefore, the container platform is lifted off of the platform support by the elevator platform.

Various refinements exist of the features noted above in relation to the third aspect of the present invention. Further features may also be incorporated in the third aspect of the present invention as well. These refinements and additional features may exist individually or in any combination. The use of a container platform and a separate elevator platform allows the elevator to be disconnected from the housing without having to first unload any containers from within the housing. The elevator may be moved in an at least generally downward direction. At a certain point in time in this downward movement, the elevator platform will become disengaged from the container platform. At this time the container platform will then be supported by the platform support that is associated with the housing of the material delivery system of the third aspect, and not the elevator. Therefore, the elevator may be disconnected from the housing without having to unload any of the containers. Those features discussed above in relation to the connection between the housing and the elevator in the second aspect may be utilized by the third aspect as well.

Both the container platform and the elevator platform may include a plurality of perforations, which facilitates the use of the material delivery system of the third aspect in a filtered environment that uses an at least generally downwardly directed flow to maintain a desire degree of cleanliness. Control of the movement of the elevator in the third aspect may be in the manner discussed above in relation to the first aspect of the present invention.

BRIEF DESCRIPTION OF THE DRAWINGS

FIG. 6A is an exploded, enlarged perspective view of a guide rod assembly from the material delivery elevator of FIG. 4.

FIG. 6B is an exploded, enlarged perspective view of components of the guide rod assembly of FIG. 6A.

FIG. 7 is an exploded, enlarged perspective view of a drive screw rod assembly from the material delivery elevator of FIG. 4.

FIG. 12 is one embodiment of a work station which uses an embodiment of a material delivery system.

FIG. 13 is another embodiment of a work station which uses an embodiment of a material delivery system.

DETAILED DESCRIPTION OF THE INVENTION

Figure 1:
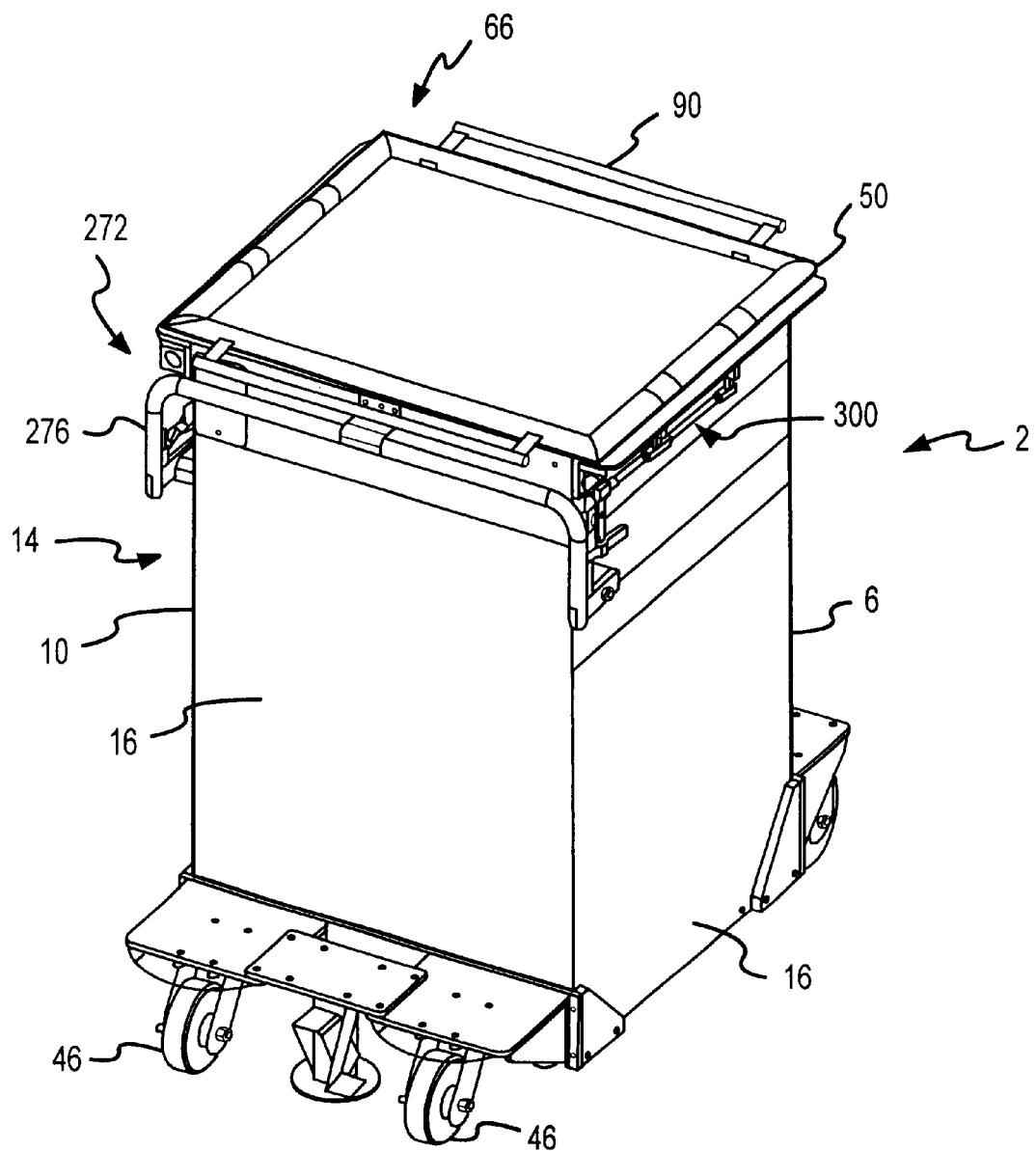
FIG. 1 is a perspective view of one embodiment of a material delivery system.

First a number of other aspects of the present invention will be addressed generally, followed by a description of various embodiments which encompass the various aspects identified herein in relation to the accompanying drawings. Other aspects of the present invention generally relate to material delivery systems and, more particularly, to material delivery systems for use in clean room-like environments which include a station. "Stations" for purposes of the present invention include any zone or area where products are stored, assembled, subject to transport, or acted upon by any type of processing apparatus and/or operations personnel. "Clean room-like environments" include clean rooms as well as minienvironments of the type discussed above.

A fourth aspect of the present invention relates to a material delivery system which may exist as a stand-alone unit (e.g., a portable cart, an enclosure of sorts with wheels, casters, or other transport mechanism) or which may be incorporated into the design of a given station (e.g., by being fixedly interconnected with at least a portion of the station such as a work table or the like). The material delivery system includes at least some type of enclosure which may be defined at least in part by a sidewall assembly. In one embodiment the vertical extent or height of this enclosure is such that it may be disposed "under" stations of the above-noted type. Positioning the enclosure of the material delivery system of the fourth aspect of the present invention in this manner reduces the space requirements in the work area at issue by taking advantage of space which is typically wasted in the above-noted types of environments and which is often thought of as being "dirty." Products (including component parts) used at the station may be stored within the confines of the enclosure. In another embodiment of this fourth aspect of the present invention, the material delivery system includes an elevator which is disposed at least somewhere within the confines of the enclosure for moving a payload therewithin. Preferably, both of these embodiment are used in combination although such is not required. In the case of the noted combination, a payload may be stored in each of a plurality of trays which are stacked within the confines of the enclosure and raised by the elevator to a suitable height for access by equipment, operations personnel, or both at the station.

Various refinements exist of the features noted above in relation to the fourth aspect of the present invention. Further features may also be incorporated in the present invention as well. These refinements and additional features may exist individually or in any combination. The station with which the material delivery system of the present invention is at least interfaceable therewith may include a table top or the like on which one or more processing/assembly operations are performed. One or more apertures may extend through this table in alignment with the elevator such that product may be brought up through this aperture(s) to an upper surface associated with the table, all by an upward movement of the elevator through the enclosure. Materials present at any one of these apertures through the table may be characterized as being within a material handling zone or the like. Other areas may exist at the station as well, including one or more work areas. Materials provided to the station by the material delivery system may be transported either manually or via robotics to one or more areas throughout the station. In the case of a minienvironment, materials may be provided by the upward movement of the elevator to one or more material handling zones (e.g., by having a plurality of separate trays disposed at a common level on the elevator, by using a partitioned tray) and the minienvironment may include one or more workstations or the like.

The elevator may include a vertically movable platform within the enclosure which functions as a support surface or the like for the elevator. One or more trays may be positioned on this platform in stacked relation, in side-by-side relation, or both, with each tray typically including a plurality of parts. Both partitioned (e.g., for segregating parts within a given tray) and non-partitioned trays (e.g., for containing a plurality of the same parts) are contemplated. The area within the enclosure in which products may be stored on the platform may be characterized as a material storage space within the enclosure. Although the elevator could be configured to remove an empty tray from a certain position and replace the same with a tray having more of the desired parts (e.g., a continuous loop conveyor-like system), as will be discussed in more detail below, in one embodiment the drive assembly for the elevator of the material delivery system may include a simple lead screw-based drive assembly.which includes one or more rotatably driven lead screws. In this case it may be necessary to manually remove the empty trays from the material delivery system at the station. These empty trays may be provided to a material disposal area or the like, such that trays may be characterized as being disposable.

Movement of the platform within the enclosure may be characterized as being between a lowermost and an uppermost position, with the lowermost position being disposed at least about 24 inches (60.96 centimeters) below that area where it is desired to provide the materials. With some of the materials being disposed at this elevation below the station, this emphasizes the desirability of including an elevator within the material delivery system to alleviate the need for the operator to reach down into the enclosure to retrieve product. An infinite number of positions of the elevator relative to the enclosure may be realized to tailor the material delivery system to the needs of a particular station or to a particular operator. One way to affect this movement is to have a drive assembly controller for a drive assembly (e.g., motor) used by the elevator. This drive assembly controller may be operated by operations personnel to dispose the elevator at the desired height, and thereby the product provided thereby. Simplification of one or more aspects of the material delivery system may be realized by actually maintaining the drive assembly controller at the station. As such and particularly in the case of a portable material delivery system, once the material delivery system is positioned relative to the station, all that need be done is to interconnect the drive assembly controller and the drive assembly by a communications cable or the like (e.g., plug the communications cable into the appropriate location on the material delivery system, such that the material delivery system need not include any significant electronics).

The elevator platform may also be viewed as defining an upper chamber and a lower chamber within the enclosure, with the upper chamber being available for product storage and subsequent transport by the elevator. These upper and lower chambers need not, and preferably are not, isolated from each other at all times, particularly for the case when the material delivery system is used with a minienvironment. Minienvironments typically use a forced air system which directs filtered air into the minienvironment from a location above the work surface area to direct particulates and other contaminants away from the work surface area and preferably out of the minienvironment. Preferably the material delivery system does not affect the air flows provided by this forced air system, and thereby does not significantly affect the cleanliness levels within the minienvironment. In this regard, a space may be provided about at least a portion of the perimeter of the platform to fluidly interconnect the above-noted upper and lower chambers of the enclosure. Preferably an annular spaces exist between the perimeter of the platform. Other ways of fluidly interconnecting the defined upper and lower chambers may be used, although the space about at least a portion of the platform's perimeter is currently preferred. Flows from the minienvironment which enter the upper chamber and "flow" over the product therein may also flow down into the lower chamber of the enclosure.

Allowing flow from the noted upper chamber to the noted lower chamber within the enclosure reduces the effects of the material delivery system on the cleanliness of the minienvironment. Additional features may be incorporated to further reduce the potential for a disruption of the minienvironment by the presence of the material delivery system in accordance with principles of the present invention. In this regard, the enclosure of the material delivery system may include a bottom such that the lower chamber is disposed at least somewhere between the bottom and the elevator's platform. A plurality of perforations may be included in this bottom structure. Pressurized fluid which enters the lower chamber may then be discharged from the enclosure through these plurality of perforations. This further reduces the potential for the material delivery system of the present invention adversely affecting the air quality of the minienvironment.

In at least certain instances it will be desirable to isolate the product within the upper chamber from the environment in which the enclosure of the material delivery system of the present invention is disposed. In the case where the above-noted perforations are incorporated on a bottom of the enclosure, stated another way preferably there is a way to seal these perforations off from the upper chamber. Consider the case where the material delivery system is a portable cart or the like for providing product to a minienvironment. In this regard, "clean"product likely will be loaded into the upper chamber of the enclosure at a location which is outside of the area in which the minienvironment is located. Attempts will typically be made to maintain the level of cleanliness of these "clean" products during this loading procedure as well. A number of features may be incorporated into the material delivery system of the present invention to attempt to maintain this level of cleanliness during the transport of the material delivery system of the present invention to the minienvironment. One such feature is incorporating a gasket on the above-noted bottom of the enclosure. This gasket may be configured to totally surround the area of the bottom having the above-noted plurality of perforations. An extension then may be interconnected with the platform of the elevator to sealingly engage with this gasket about its entire circumference. Typically, this will be the case only when the elevator is disposed in its lowermost position (e.g., when the enclosure is "full" of product). After the material delivery system is "parked" at the minienvironment, the platform may be raised to provide product in the above-noted manner. This movement of the platform may then disengage the extension from the gasket to allow air flow from the minienvironment to flow into the upper chamber, into the lower chamber, and then out of the enclosure through the now "un-sealed" plurality of perforations.

Another feature which may be included in the material delivery system and which is applicable to maintaining at least a certain level of cleanliness within the enclosure, for instance during transport of the material delivery system, is an access to an interior of the enclosure which contains product. In this regard, the enclosure may include an opening through which product may be loaded into the enclosure. This opening may be sealed by a cover or top which is removable from an uppermost portion of the enclosure in at least some respect. Both a total removal and a partial removal of this top (e.g., using a hinge to allow the top to pivot away from the enclosure) are contemplated. The top may interface with one or more flanges or the like formed on the enclosure to enhance the seal between the enclosure and the top. One or more gaskets may be included in the interface between the top and the enclosure to further enhance the seal therebetween. Compression of the top against the enclosure may also be used to enhance the seal therebetween. Any combination of these cover-to-enclosure sealing features may be used as well.

Preferably the area of the enclosure in which product is stored is at least substantially isolated from the remainder of the material delivery system of the present invention. An additional feature which relates to this issue is how the elevator's platform interconnects with the remainder of the elevator and which is subject to a number of characterizations. Broadly stated, the mechanical interconnection(s) of the platform with the remainder of the elevator is disposed at an elevation which is below that of an uppermost surface of the platform. In one embodiment, at least one and preferably one or more of guide rods, lead screws, or both, are used to advance the platform vertically within the enclosure. The area within the enclosure through which the platform travels may be at least substantially isolated from these guide rods/lead screws. For instance, one or more vertically extending partitions may be disposed inwardly and spaced from an adjacent portion of the enclosure so as to be disposed between the platform and each guide rod/lead screw. That is, the guide rods/lead screws may be disposed within this space or spaces between a periphery of the platform and the inner surface of the enclosure. Consider an example where the platform is at least substantially rectangular or square. One guide rod, one lead screw, or both may be disposed on one side of the platform, and one guide rod, one lead screw, or both may be disposed on an opposite side of the platform. One partition may be disposed between the platform and guide rod(s) and/or lead screw(s) on one of the noted sides of the platform to provide the desired degree of isolation, and another partition may be disposed between the platform and guide rod(s)/lead screw(s) on the other of the noted platform sides. The structure (e.g., a coupling, bracket, connecting rod, or the like) which connects the platform with a particular guide rod or lead screw may extend through a split seal (e.g., a pliable material with a slit therethrough) formed in the subject partition. In cases where the guide rod(s)/lead screw(s) are vertically disposed, so to will be the corresponding split seal(s).

The elevator includes a drive system of at least some type to advance the platform within the enclosure. One appropriate type of drive system uses the above-noted lead screw(s). In this regard, a motor may be disposed within the enclosure somewhere below the partition. At least some degree of isolation is thereby provided between the motor and the product which is on/stacked upon the platform (e.g., this further reduces the potential for the existence of the motor "contaminating" such product). Further reductions in the potential for the drive system "contaminating" the product on the platform may be realized by establishing the interconnection between this motor and the lead screw(s) somewhere outside of the enclosure. In this regard, the motor's shaft may extend through a bottom of the enclosure, as may each lead screw used by the drive assembly. One or more pulleys may be fixed to that portion of the motor's drive shaft which extends through and beyond the enclosure. A drive transfer member such as a continuous loop of rubber, chain, or the like may then be looped around the motor pulley and the corresponding lead screw (which may also include a pulley) to interconnect the rotating drive shaft of the motor with each lead screw. Rotation of the lead screw(s) then raises or lowers the platform which will somehow be threadably interconnected with the lead screw (either directly or indirectly). Stability of the platform during travel within the enclosure is provided by disposing rotatably-driven lead screws on diagonally opposite corners of the platform and disposing guide rods on diagonally opposite corners of the platform such that there is a single guide rod or lead screw effectively at each corner of the platform. Rotation of the lead screw(s) "drives" the platform or moves the same within the enclosure, while there is a sliding interrelation between the platform and guide rod(s).

A fifth aspect of the present invention relates to an improved clean cart of sorts which may be used in a filtered environment, such as a clean room, minienvironment, or the like, and such may be used in combination with those features discussed above in relation to the fourth aspect of the present invention. The clean cart includes a body and a cover which is removable therefrom through a cover lifting assembly. An enclosed material storage area is defined at least in part by the body and the cover. Since the clean cart is for filtered environments, the material storage area is sufficiently sealed to maintain contamination levels at least as clean as a Class 100 environment in accordance with Federal Standard 209.

Various refinements exist of the features noted above in relation to the fifth aspect of the present invention. Further features may also be incorporated in the fifth aspect of the present invention as well. These refinements and additional features may exist individually or in any combination. How the cover lifting assembly may act on the cover to remove the same from the body is subject to a number of characterizations. The cover lifting assembly may act on the cover so as to move the cover away from the body along a substantially axial or linear path (e.g., "straight" away from the body). This reduces the potential for degradation of any gasket which may be attached to the cover to provide a more suitable seal between the cover and the body of the cart since the gasket will not be exposed to any shear-like forces when removed in this manner. The cover lifting assembly may also be characterized as pushing upwardly on the cover to displace the same from the body.

The body in the subject fifth aspect may include at least one cover support surface, and this cover support surface may include at least one aperture which extends entirely therethrough. Preferably there is at least a pair of such cover support surfaces which are disposed on opposite sides of the body. Wheels may be provided on the lower surface of the cover to assist in removal of the cover from the body. When the cover is seated onto the body via the cover support surface(s), each of these wheels may be disposed within and extend completely downwardly through one of the apertures which is aligned therewith. These wheels may be acted upon to push the cover away from the body for purposes of cover removal, and therefore may be considered as part of the cover lifting assembly. Another function may be provided by the these wheels. Once the wheels are disposed in at least substantially co-planar relation with their corresponding cover support surface, the cover may be rolled off of the body of the cart. In a case where a gasket is attached to the lower surface of the cover to provide a desired seal between the cover and the body, having these wheels extend further away from the lower surface of the cover than the gasket will then displace the gasket from the cover support surface during this rolling motion. As such, the gasket will not be exposed to any shearing-like forces which will thereby prolong the life of the gasket.

The above-noted aperture(s) in the cover support surface (s) may be utilized to lock the cover onto the body, alone or in combination with the above-noted cover "lifting" function. In this regard, the cover may include at least one first latch member which extends downwardly through an aperture in the cover support surface aligned therewith. A second latch member may be interconnected with the body and further may be engageable with its corresponding first latch member so as to "lock" the cover onto the body, or to restrict relative movement between the cover and body in at least one direction. Preferably, the noted aperture(s) in the cover support surface(s) is used to both "lock" the cover to the body, and further to lift the cover away from the body. In this regard, a first latching and camming assembly may be interconnected with the cover and extend downwardly into and preferably through an aligned aperture in the cover support surface. A second latching and camming assembly may be movably interconnected with the body of the cart. In a first position, the second latching and camming assembly engages its corresponding first latching and camming assembly so as to "lock" the cover onto the body in the above-described manner. Movement of the second latching and camming assembly from its first position at least toward its second position first "unlocks" the cover from the body, and thereafter directs the first latching and camming member upwardly through its corresponding aperture to displace the cover from the body and to allow for removal of the same. In one embodiment, the second latching and camming assembly is directed upwardly within its corresponding aperture to not only direct its corresponding first latching and camming assembly in the above-described manner, but to further provide a surface which is at least substantially co-planar with the adjoining cover support surface. This is particularly desirable where the first latching and camming assembly includes a roller for rolling the cover off the body.

More than one first latching and camming assembly and more than one second latching and camming assembly may be provided for each cover support surface. For instance and in the case where there are two such cover support surfaces disposed on opposite sides of the body of the cart, two displaced first latching and camming assemblies may be provided on the cover on one side thereof, while two displaced first latching and camming assemblies may be provided on the opposite side of the cover. Similarly, two second latching and camming assemblies may be disposed on one side of the body of the cart, and two second latching and camming assemblies may be disposed on the opposite side of the body of the cart. An appropriate linkage may interconnect the second latching and camming assemblies which are located on the same side of the body of the cart. Both of these linkages in turn may be activated by interconnecting these linkages with a common handle which may be pivoted in one direction to seal the cover onto the body, and which may be pivoted in the opposite direction to lift the cover from the body in the above-described manner. The handle may also be used to transport the cart from one locale to another, such as by incorporating wheels on the bottom of the cart.

Figure 2:
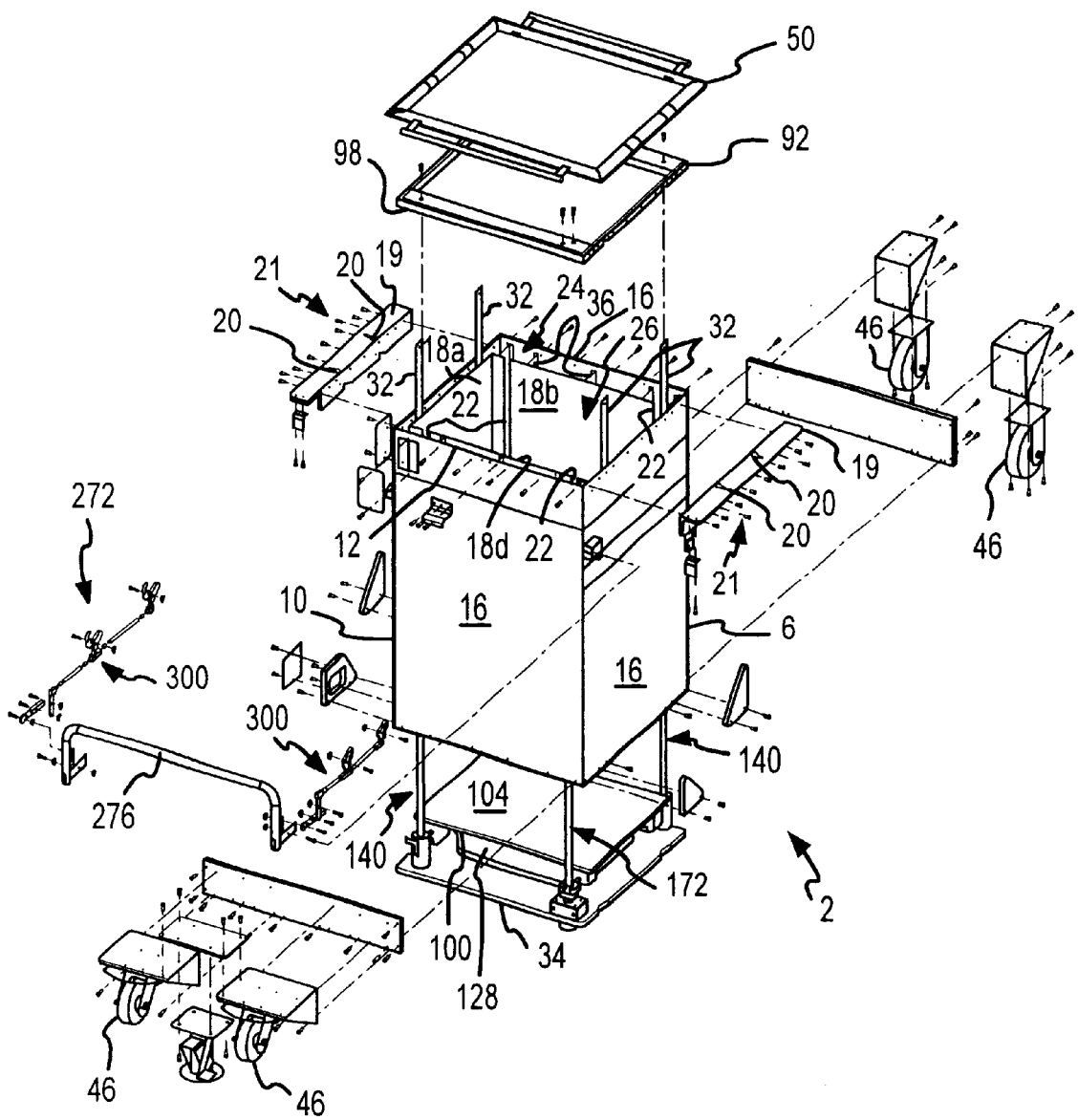
FIG. 2 is exploded, perspective view of the material delivery system of FIG. 1.
Figure 3A:
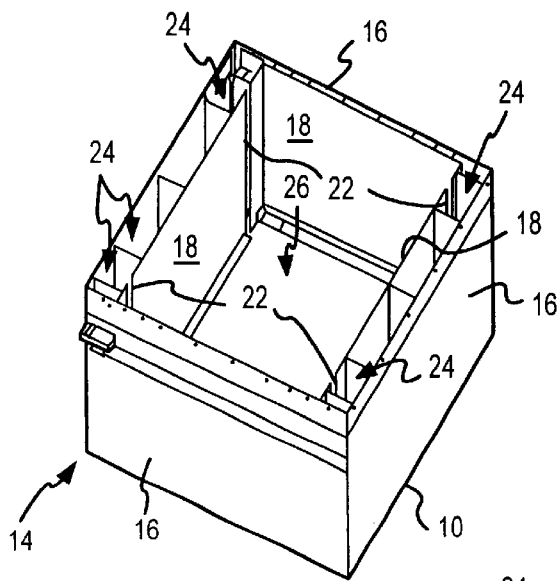
FIG. 3A is a perspective view of a lower open end of a body of the material delivery system of FIG. 1.
Figure 3B:
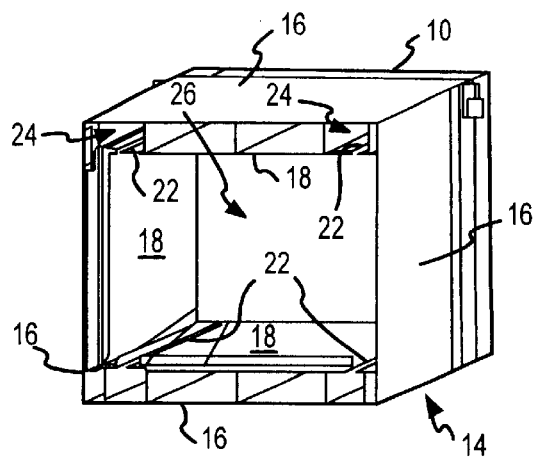
FIG. 3B is another perspective view of the lower open end of the body of the material delivery system of FIG. 1.
Figure 3C:
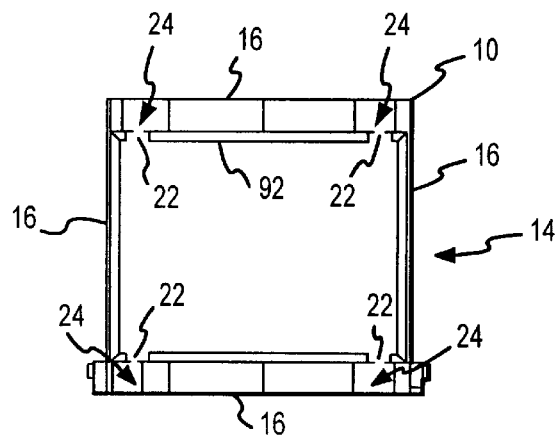
FIG. 3C is a top view of the body of the material delivery system of FIG. 1 with a portion of a gasket interface section disposed on an upper portion thereof being removed.

The present invention will now be described in relation to the accompanying drawings which at least assist in illustrating its various pertinent features. FIGS. 1 and 2 illustrate a material delivery system 2 which provides a number of desirable functions. One function of the material delivery system 2 is to provide an at least substantially sealed environment in which parts, components, or the like may be stored. This renders the material delivery system 2 particularly useful for transporting such parts to filtered environments such as a clean room or minienvironment. Portability is also provided by the material delivery system 2 of FIGS. 1–2 which allows the same to be loaded with parts in one locale (e.g., outside of a clean room, outside of a room which contains one or more minienvironments) for subsequent transport to another locale (e.g., within a clean room, within a room which contains one or more minienvironments). Delivery of its payload to a desired elevation is also made available by the material delivery system 2 for access by an operator or transport/assembly/processing apparatus.

The material delivery system 2 of FIGS. 1–2 is in the form of a clean cart 6 of sorts having a plurality of wheels 46 to provide the noted portability feature. The cart 6 further generally includes a body 10, a top or cover 50, and a bottom 34 which are appropriately interconnected and collectively define an enclosed space 26, at least part of which may be used for the storage of parts or any other desired payload. Access to this material storage space 26 is provided by having the cover 50 being detachably interconnected with the body 10. Parts or any other payload for that matter may be loaded into the enclosed space 26 and onto a material delivery elevator 100 disposed therein after removal of the cover 50. Once loaded, the cover 50 may be installed on the body 10 and preferably sealed thereto, for instance to maintain any cleanliness standards associated with parts loaded therein. Thereafter the material delivery system 2 may be readily transported to the desired locale via the rolling action provided by the wheels 46. Parts stored in the material delivery system 2 may then be made available to an operator, relevant equipment (e.g., any device used in the manufacture of disk drives), or both by removing the cover 50 from the body 10. Activation of the material delivery elevator 100 may then be affected to dispose the parts at a desired elevation for access by an operator and/or any appropriate equipment.

FIGS. 1–3C illustrate various features of the body 10 of the cart 6. Initially, the body 6 is defined by a sidewall assembly 14 which is disposed entirely or circumferentially about a reference point or axis to provide a continuous perimeter for the body 10. An upper portion of the body 10 includes an upper open end 12. The sidewall assembly 14 in the illustrated embodiment is defined by four panels 16 which are appropriately interconnected. Attached to a pair of opposing panels 16 at an upper portion thereof (via a plurality of fasteners 21) are a pair of cover support surfaces 19 which interface with the cover 50 when disposed thereon and which further facilitate removal of the cover 50 from the body 10. A pair of apertures 20 are provided on each cover support surface 19 for latching the cover 50 onto the body 10, preferably in sealing relation. Also appropriately attached to the body 10 in proximity to its upper open end 12 is a gasket interface section 92 which provides the primary sealing surface between the removable cover 50 and the body 10. Further details on these features relating to the cover will be discussed in more detail below.

Disposed within the body 10 are four partitions 18 which are appropriately interconnected. Partitions 18a and 18c are separated from their corresponding panel 16 by one or more spacers 32 (FIG. 2) which extend along at least substantially the entire height of the body 10 in at least substantially vertical relation. In the assembled condition the spacers 32 do not extend beyond the upper open end 12 of the body 10, but instead are "sandwiched" between their corresponding panel 16 and partition 18. The space between the panels 16 and their corresponding partitions 18a and 18c is relatively small.

Each of the partitions 18b, 18d are disposed inwardly from one of the panels 16 such that there is a vertically disposed space 24 therebetween (i.e., a space which extends along the height of the cart 6). Maintenance of each these spaces 24 is provided by a plurality of spacers 36 which interconnect the partitions 18b and 18d with their corresponding panel 16 and maintain the same in spaced relation. Both partition 18b and 18d include a pair of vertically disposed and laterally spaced splits seals 22 which may be formed from overlapping or abutting pieces or rubber or other appropriate "seal-like" materials. Parts stored within the material storage space 26 are at least substantially isolated from at least those components of the material delivery elevator 100 which may potentially adversely affect cleanliness levels via the partitions 18b and 18d and their split seals 22.

Figure 4:
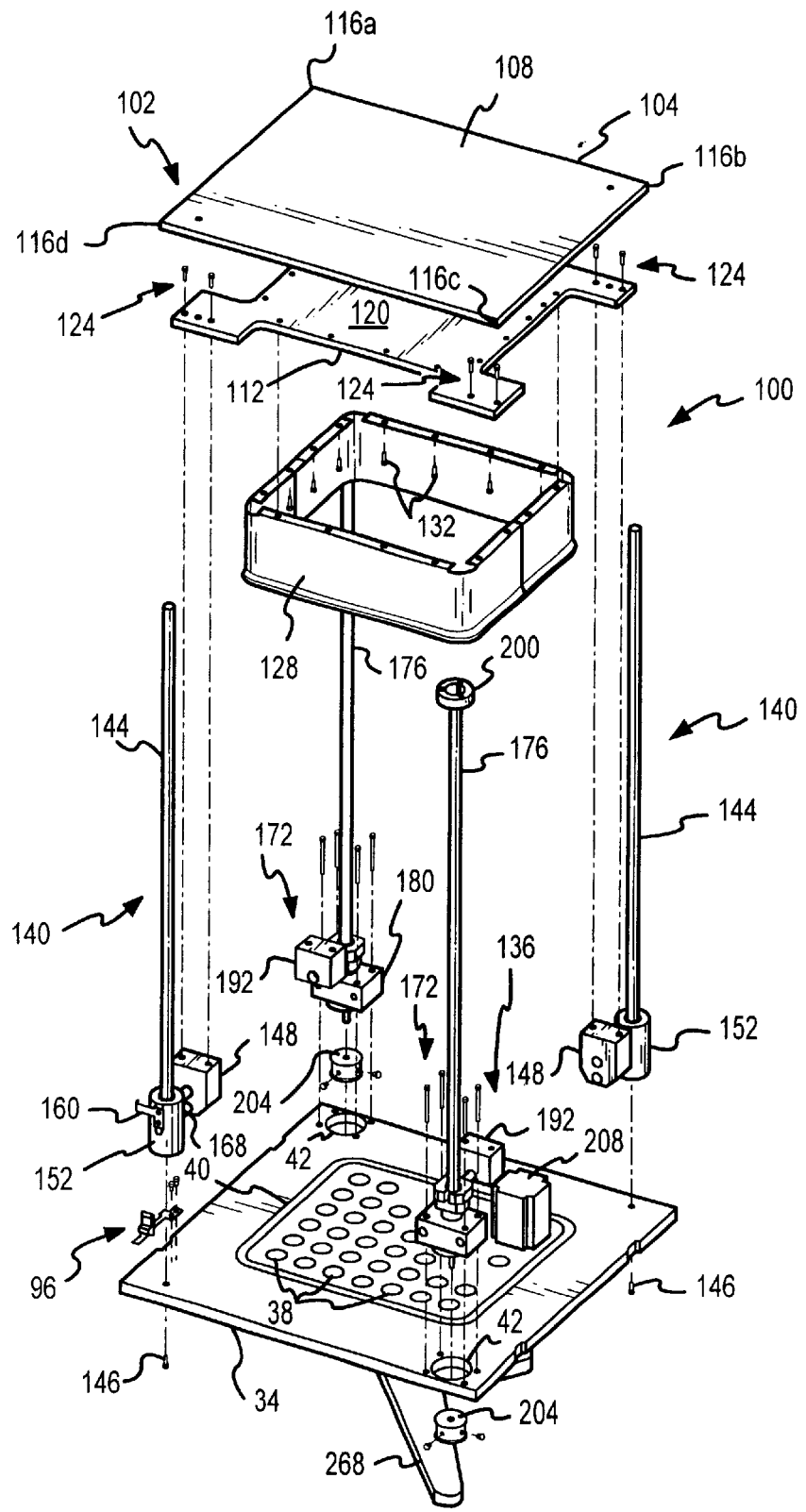
FIG. 4 is an exploded, perspective view of a material delivery elevator for the material delivery system of FIG. 1.

The material delivery elevator 100 is illustrated in FIGS. 2 and 4 and generally includes a platform assembly 102 which supports parts or any other payload contained within the material delivery system 2. Principle components of the platform assembly 102 include an upper plate or platform 104 and a drive assembly mounting plate 120. Movement of the platform assembly 102 along at least a substantially linear or axial path within the body 10 is provided by a drive assembly 136 of the material delivery elevator 100 which is appropriately interconnected with the drive assembly mounting plate 120. In this regard, the drive assembly 136 includes a pair of guide rod assemblies 140 and a pair of lead or drive screw rod assemblies 172 which each extend upwardly from the bottom 34 of the cart 6. The guide rod assemblies 140 and drive screw rod assemblies 172 are disposed at least generally at the four corners 116a–d of the platform assembly 102. One guide rod assembly 140 is disposed at the corner 116d, while the other guide rod assembly 140 is disposed at the corner 116b which is "kitty-corner" or diagonally disposed therefrom. Similarly, one drive screw rod assembly 172 is disposed at the corner 116a, while the other drive screw rod assembly 172 is disposed at the corner 116c which is "kitty-corner" or diagonally disposed therefrom.

Each guide rod assembly 140 includes a shaft or guide rod 144 which is interconnected with the bottom 34 of the cart 6 by one or more fasteners 146 and which extends at least generally perpendicularly upwardly therefrom. Disposed about each guide rod 144 is a guide bushing housing 152 which includes a bushing assembly 154 which slidably interfaces with the guide rod 144. Extending from each guide bushing housing 152 are a pair of vertically spaced connector rods or pins 168. The number of connector rods or pins 168 which is used is not of particular importance. Mounted on the end of each of these connector rods 168 is a mounting block 148, which in turn is interconnected with the drive assembly mounting plate 120 of the platform assembly 102 by one or more fasteners 124. These features are illustrated in the enlarged views of FIGS. 6A–B in addition to FIG. 4.

There are a number of notable features regarding the relationship between each of the guide rod assemblies 140 and the platform assembly 102. First, the guide rod 144 and guide bushing housing 152 of each guide rod assembly 140 are disposed in one of the spaces 24 between one of the panels 16 of the body 10 and one of the partitions 18b, 18d, such that only the connecting rods 168 extend through their corresponding split seals 22. Therefore, there is at least a substantial isolation of the platform assembly 102 from the guide rod 144 and guide bushing housing 152 of each guide rod assembly 140 (i.e., a partition 18b, 18d separates the platform assembly 102 from a substantial portion of each of the guide rod assemblies 140). Furthermore, the interface between the mounting block 148 of each guide rod assembly 140 at least substantially isolates each such mounting block 148 from the upper plate or platform 104 on which the parts will be disposed in the material storage space 26. That is, each mounting block 140 directly interfaces with a lower surface 112 of the platform assembly 102 which is defined by the drive assembly mounting plate 120. Conversely, parts, components, or other materials which are being stored within the material delivery system 2 will be disposed directly or indirectly (e.g., in one or more stacked trays) on an upper surface 108 of the platform assembly 102 which is defined by the upper plate or platform 104 of the elevator 100. Another way of characterizing this relationship is to say that the interconnection between each guide rod assembly 140 and the platform assembly 102 is disposed at a lower elevation than that surface on which parts will be stored, namely the upper surface 108 of the platform assembly 102 which is defined by the platform 104, or at a lower elevation than any part stored in the material storage space 26. Therefore, the relationship between each guide rod assembly 140 and platform assembly 102 of the material delivery elevator 100 is selected so as to further reduce the potential for parts, components, or the like disposed on the platform 104 from being contaminated by either of the guide rod assemblies 140.

Changes in the position of the platform assembly 102 are affected by the noted pair of drive screw rod assemblies 172. Reference will now be made to the enlarged view of FIG. 7 in addition to FIG. 4. Each drive screw rod assembly 172 includes a threaded lead or drive screw rod 176 which rotates in one direction to raise the platform assembly 102 within the cart 6, and which rotates in the opposite direction to lower the platform assembly 102 within the cart 6. An upper end of each drive screw rod 176 is rotatably supported by an upper bearing assembly 200. Each upper bearing assembly 200 is appropriately interconnected with the lower surface of the gasket interface section 92 (FIG. 2). A lower end of each drive screw rod 176 extends through a drive screw aperture 42 formed on the bottom 34 of the cart 6. Support of this lower end of each drive screw rod 176 is provided by a lower bearing mounting block 180 which is appropriately interconnected with the bottom 34 and which allows for rotation of its corresponding drive screw rod 176.

Disposed about each drive screw rod 176 is a threaded screw rod mount assembly 184. Extending from each screw rod mount assembly 184 is a connector rod or pin 196. The number of connector rods or pins 196 which is used is not of particular importance. Mounted on the end of each of these connector rods 196 is a mounting block 192. The mounting block 192 is interconnected with the lower surface of the drive assembly mounting plate 120 of the platform assembly 102 by one or more fasteners 124.

There are a number of notable features regarding the relationship between each of the drive screw rod assemblies 172 and the platform assembly 102. First, the drive screw rod 176 and screw rod mount assembly 184 of each drive screw rod assembly 172 are disposed in one of the spaces 24 between one of the panels 16 of the body 10 and one of the partitions 18b, 18d, such that each connecting rod 196 extends through one of the split seals 22 on one of these partitions 18b, 18d. Therefore, there is at least a substantial isolation of the platform assembly 102 from the drive screw rod 176 and its corresponding screw rod mount assembly 184 of each drive screw rod assembly 172 (i.e., a partition 18b, 18d separates the platform assembly 102 from a substantial portion of each of the drive screw rod assemblies 172). Furthermore, the interface between the mounting block 192 of each drive screw rod assembly 172 at least substantially isolates each such mounting block 192 from the upper plate or platform 104 on which the parts will be disposed. That is, each mounting block 192 directly interfaces with the lower surface 112 of the platform assembly 102 which is defined by the drive assembly mounting plate 120. Conversely, parts, components, or other materials which are being stored within the material delivery system 2 will be disposed directly or indirectly (e.g., in one or more stacked trays) on the upper surface 108 of the platform assembly 102 which is defined by the upper plate or platform 104 of the elevator 100. Another way of characterizing this relationship is to say that the interconnection between each drive screw rod assembly 172 and the platform assembly 102 is disposed at a lower elevation than that surface on which parts will be stored, namely the upper surface 108 of the platform assembly 102 which is defined by the platform 104, or at a lower elevation than any part stored in the material storage space 26. Therefore, the relationship between each drive screw rod assembly 172 and platform assembly 102 of the material delivery elevator 100 is selected so as to reduce the potential for parts, components, or the like disposed on the platform 104 from being contaminated by the drive screw rod assemblies 172.

Rotation of each of the drive screw rods 176 changes the position of the platform assembly 102 within the cart 6. In this regard, a screw rod pulley 204 is fixed to the lower end of each of the drive screw rods 176 at a location which is disposed below the bottom 34 of the cart 6 as illustrated back in FIGS. 4–5. Each screw rod pulley 204 is rotated by a motor 208. This motor 208 is mounted on the bottom 34 of the cart 6 via a pair of motor mounts 220 and a plurality of fasteners 224 such that its drive shaft 212 extends downwardly through a motor aperture 228 which is recessed in the bottom 34 of the cart 6. Fixed to this drive shaft 212 at a location which is disposed below the bottom 34 is a drive pulley or sprocket 216. Transfer of the rotary motion of the drive shaft 212 of the motor 208 to each of the screw rod pulleys 204 is provided by a drive belt 268 which is in the form of a continuous loop. Other continuous loop drive members could also be utilized. Although a direct interconnection could be utilized, in the illustrated embodiment the drive assembly 136 further includes a tensioning pulley 232 and an idler pulley 252. The tensioning pulley 232 is interconnected with the bottom 34 of the cart 6 by a mounting block 236. The tensioning pulley mounting block 236 is disposed within a recess 248 formed on the lower surface of the bottom 34 of the cart 6 and is interconnected therewith by a plurality of fasteners 244. These fasteners 244 extend through slots 240 formed on the tensioning pulley mounting block 236. At least one of the slots 240 is shaped to allow for at least some modification of the position of the tensioning pulley 232 relative to the bottom 34, to in turn change the tension of the drive belt 268. Similarly, the idler pulley 252 is interconnected with the bottom 34 of the cart 6 by a mounting block 256. The idler pulley mounting block 256 is disposed within a recess 264 formed on the lower surface of the bottom 34 of the cart 6 and is interconnected therewith by a plurality of fasteners 260. These fasteners 260 extend through slots 258 formed on the idler pulley mounting block 256. These slots 258 are not shaped to allow for at least some modification of the position of the idler pulley 252 relative to the bottom 34 in the illustrated embodiment, to in turn change the tension of the drive belt 268, although such could be utilized here as well.

Figure 8:
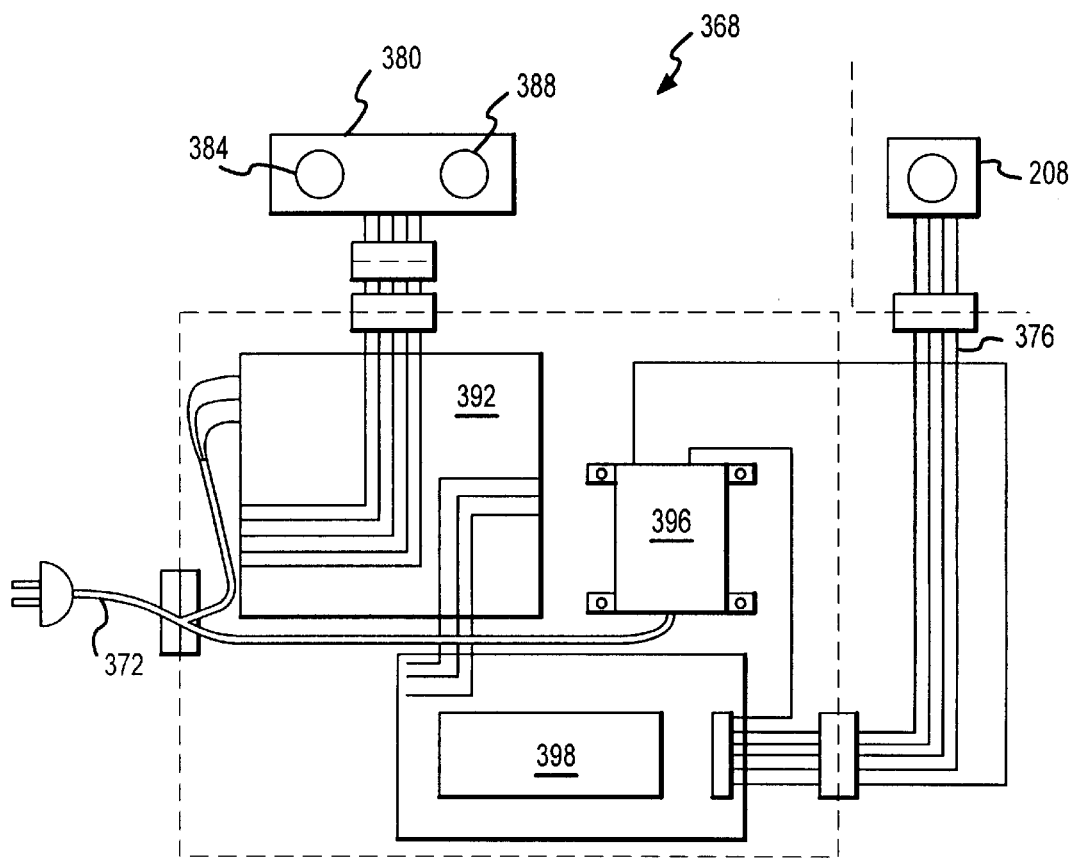
FIG. 8 is a schematic of a drive assembly controller for the material delivery elevator of FIG. 4.

Control of the drive assembly 136 of the material delivery elevator 100 is provided by a drive controller assembly 368 which is presented in FIG. 8. The drive controller 368 generally includes a programmable logic control or PLC 392 and a transformer 396, which are powered via a power supply cable 372, as well as a motor controller board 398 and an operator control 380 which are all appropriately interconnected with the motor 208 of the drive assembly 136 for the material delivery elevator 100. The operator control 380 is preferably interconnected with the PLC 392 by a quick disconnect type connector, while a motor command cable 376 which interconnects the motor controller board 398 and the motor 208 also preferably utilizes such a quick disconnect type connector. As such, the "electronics" associated with the material delivery system 2 may remain at the station where the material delivery system 2 is actually being used (e.g., station 400, station 432 to be discussed below), or such that the cart 6 need not include such electronics.

The operator control 380 includes both an "up" button 384 to cause the platform assembly 102 to move in a vertically upward direction and a "down" button 388 to cause the platform assembly 102 to move in a vertically downward direction. In one embodiment, the PLC 392 is structured such that an operator may press the "up" button 384 to place the platform assembly 102 at the desired height within the cart 6 (i.e., at any position desired by the operator), while any engagement of the "down" button 388 will cause the platform assembly 102 to move to its lowermost extreme within the cart 6 (i.e., activation of the "down" button 388 causes the platform assembly 102 to travel to its "bottom dead center" position). In this regard, a sensor trigger or flag 156 is interconnected with the guide bushing housing 152 of at least one of the guide rod assemblies 140 via one or more fasteners 164 (FIGS. 4 and 6A–6B), while a sensor 98 is interconnected with the body 10 of the cart 6 (FIG. 2) to determine when the platform assembly 102 has reached its uppermost extreme so as to discontinue any further upward travel of the platform assembly 102. Similarly, a sensor trigger or flag 160 is interconnected with the guide bushing housing 152 of at least one of the guide rod assemblies 140 via one or more fasteners 164 (FIGS. 4 and 6A–6B), while a sensor 96 is interconnected with the body 10 of the cart 6 (FIG. 4) to determine when the platform assembly 102 has reached its lowermost extreme so as to discontinue any further downward travel of the platform assembly 102.

Figure 9:
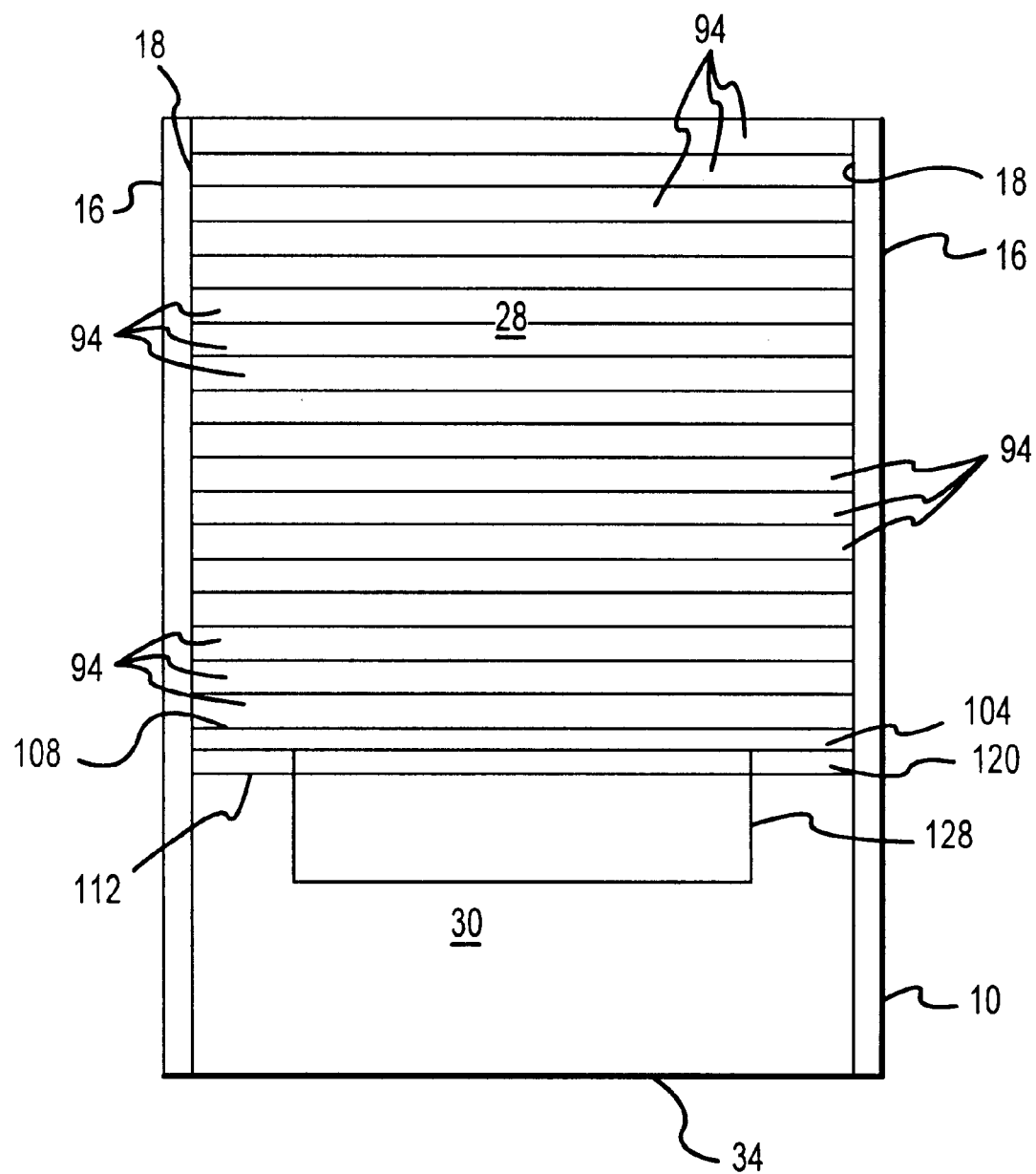
FIG. 9 is a cutaway view of the material delivery system of FIG. 1 to show a material storage area with a stack of trays with parts loaded therein.
Figure 10A:
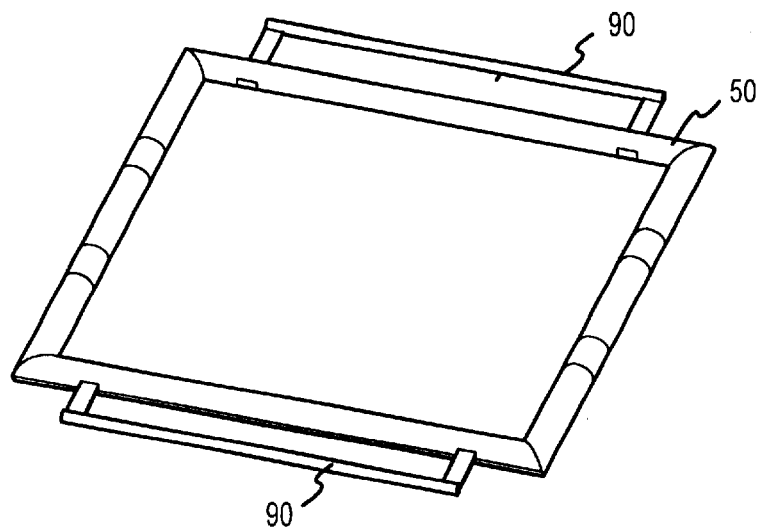
FIG. 10A is a perspective view of an upper surface of a top or cover for the material delivery system of FIG. 1.
Figure 10B:
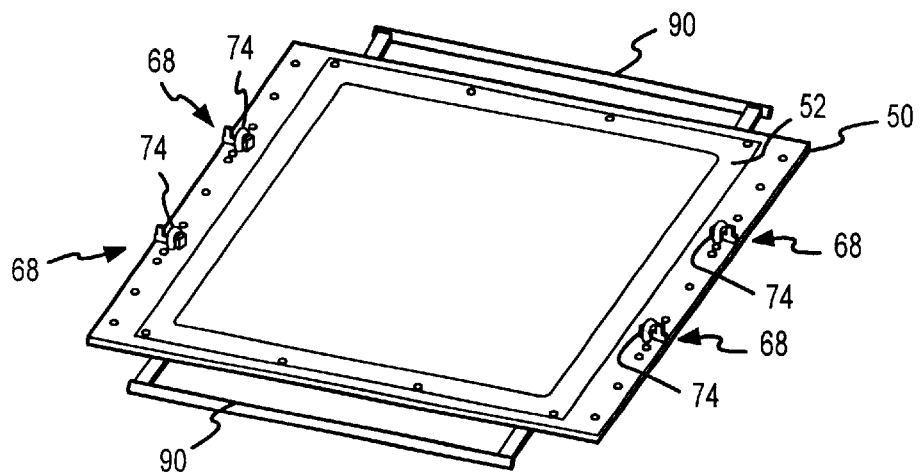
FIG. 10B is a perspective view of a lower surface of the cover presented in FIG. 10A.
Figure 10C:
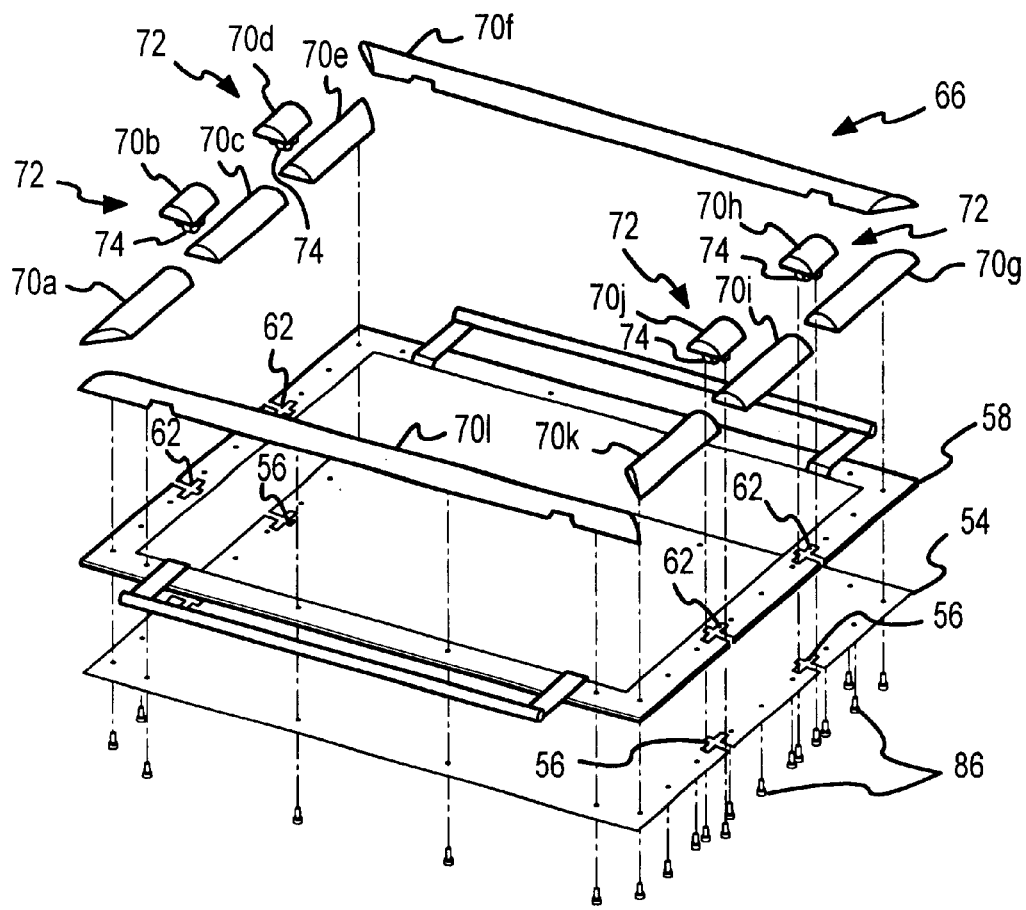
FIG. 10C is an exploded, perspective view of the cover presented in FIG. 10A.
Figure 10D:
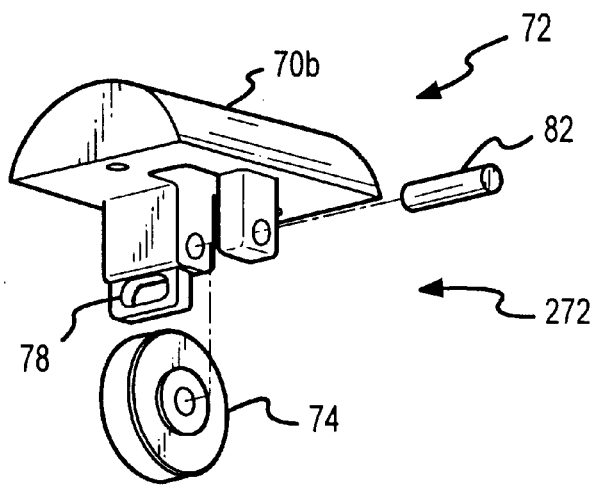
FIG. 10D is an exploded, perspective view of a portion of a first cover latch/lift subassembly of a cover latch/lift assembly which both latches and lifts the cover of FIG. 10A onto/from the body of the material delivery system of FIG. 1.

FIG. 9 depicts the cart 10 with a plurality of trays 94 stacked on the upper surface 108 of the platform assembly 102 (i.e., on the platform 104) which is disposed somewhere between its bottom dead center and top dead center positions. This is a representative position in which the material delivery system 2 will be in when parts are being supplied to an operator, equipment, or both, and which will be discussed in more detail below in relation to FIGS. 12–14. Each of these trays 94 may include one or more parts, and more typically a plurality of identical parts. The operator may engage the "up" button 384 on the operator control 380 to advance the platform assembly 102 so as to dispose one of the trays 94 at the upper open end 12 of the cart 6. Once all of these parts in this particular tray 94 have been used, the operator may manually remove this now empty tray 94 from the material delivery system 2, such as for appropriate disposal in the case where the trays 94 are disposable (i.e., non-reusable). The operator may then again hit the "up" button 384 on the operator control 380 to further advance the platform assembly 102 in an upwardly direction to place the next "full" tray 94 to the position or elevation desired by the operator/equipment. In its lowermost extreme, the platform assembly 102 is disposed at least about 24 inches (60.96 centimeters) from the open end 12 of the body 10, which emphasizes the desirability of the material delivery elevator 100.

After all of the trays 94 have been emptied in the above-noted manner or when the platform assembly 102 has reached its top dead center position, any further activation of the "up"button 384 by the operator will not have any effect on the position of the platform assembly 102. The PLC 392 could be structured to thereafter automatically retract the platform assembly 102 to its bottom dead center position. Retraction of the platform assembly 102 to this bottom dead center position may also be affected by engagement of the "down" button 388 on the operator control 380 of the drive controller assembly 368.

Further features of the material delivery system 2 are illustrated in FIG. 9. Initially, it can be seen that the enclosed space 26 is divided into an upper chamber 28 and a lower chamber 30. The upper chamber 28 is that portion of the enclosed space 26 which is disposed at a higher elevation or above the platform assembly 102 (i.e., where the parts are stored, and thereby a material storage space or zone), while the lower chamber 30 is that portion of the enclosed space 26 which is disposed at a lower elevation or below the platform assembly 102 (i.e., where various parts of the drive assembly 136 for the material delivery elevator 100 are located). Since the platform assembly 102 moves relative to the body 10 of the cart, the size of the upper chamber 28 and lower chamber 30 changes as well.

Figure 5:
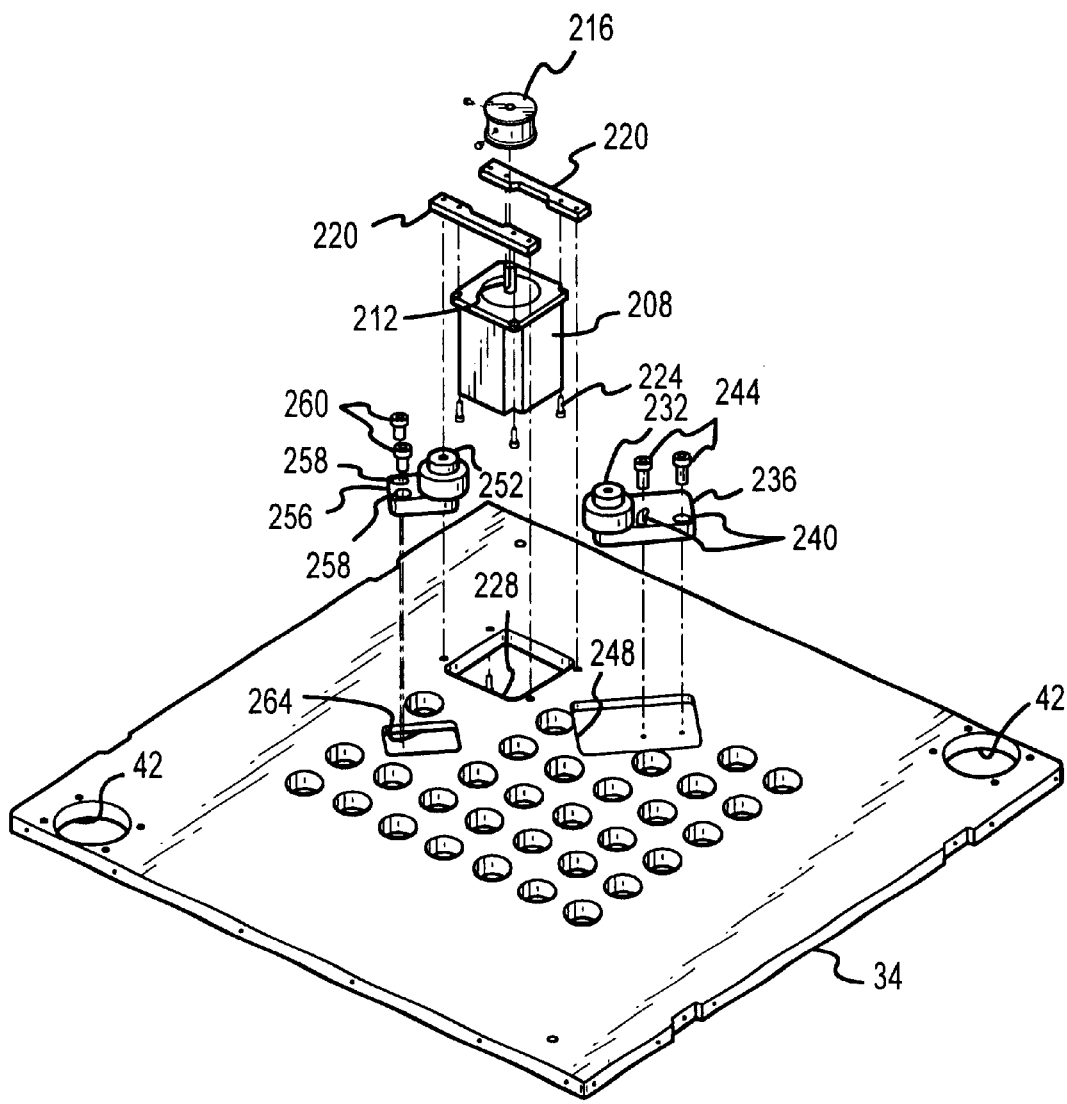
FIG. 5 is an exploded, perspective view of a lower surface of a bottom attached to the body of the material delivery system of FIG. 1, as well as other components of the material delivery elevator located thereat.

Another feature illustrated by consideration of FIG. 9, in addition to FIGS. 4–5, is a sealing/non-sealing feature provided by the material delivery elevator 100 and which is determined by the position of the platform assembly 102. In this regard, the bottom 34 includes a plurality of perforations 38 which fluidly interconnect the lower chamber 30 with the environment in which the material delivery system 2 is disposed. As will be discussed in more detail below, the material delivery system 2 is particularly useful in combination with a minienvironment. Minienvironments, and clean rooms for that matter, typically direct a downward flow of air or other appropriate gases onto the assembly/ production area in an attempt to maintain a certain cleanliness level. The presence of material delivery system 2 in these types of applications does not significantly affect the cleanliness levels, and this is due at least in part to the existence of the perforations 38. That is, any air flows to which the material delivery system 2 is exposed are not significantly adversely affected since the flows are allowed to continue downwardly through the material delivery system 2, principally through the upper chamber 28, through a small space between the perimeter of the platform assembly 102 and the partitions 18, and into the lower chamber 30 for discharge to the environment through the plurality of perforations 38 formed on the bottom 34. Portions of the gasket interface section 92 seals the upper ends of the spaces 24.

Other situations exist in which it would desirable to actually isolate the contents of the upper chamber 28 from the environment in which the material delivery system 2 is contained, such as during transport of the material delivery system 2 from a loading area to an assembly/processing area where these parts are to be used in some manner (e.g., disk drive assembly). In this regard and continuing to refer to FIGS. 4, 5, and 9, the material delivery elevator 100 further includes a standoff 128 which is appropriately interconnected with the platform assembly 102 by a plurality of fasteners 132 and which extends at least generally downwardly therefrom. A gasket or other appropriate seal 40 is also disposed about the area of the bottom 34 which contains the plurality of perforations 38 and is appropriately attached to the bottom 34. All of the perforations 38 are thereby disposed inwardly from the gasket 40, which may then be characterized as surrounding or "encircling" the perforated area of the bottom 34 of the cart 6. When the platform assembly 102 is disposed in its bottom dead center position or at its lowermost extreme, the standoff 128 engages the gasket 40 to at least substantially seal the upper chamber 28 from the environment in which the material delivery system 2 is disposed. Fluids from the environment which pass through the perforations 38 at this time are at least substantially precluded from flowing past the seal established by the engagement of the standoff 128 with the gasket 40, and thereby are at least substantially precluded from flowing into the upper chamber 28 where the "clean" parts will be retained. At least after a certain amount of upward travel of the platform assembly 102, via activation of the "up" button 384 on the operator control 380 as discussed above, this seal will be removed by a sufficient disengagement of the standoff 128 form the gasket 40 such that any flows entering the material delivery system 2 may be discharged through the perforations 38 in the above-noted manner.

The end 12 of the body 10 of the cart 6 through which parts are transferred out of the material delivery system 2 is also sealable. As noted above, the material delivery system 2 includes a top or cover 50 which is detachably interconnected with the body 10 at its upper open end 12. Referring now to FIGS. 10A–D, the cover 50 includes a solid plate 54, a frame 58, and a molding assembly 66 which are appropriately interconnected by a plurality of fasteners 86. The molding assembly 66 is defined by a plurality of molding sections 70a–k. Four of these molding sections 70, namely molding sections 70b, 70d, 70h, and 70j, each may be further characterized as a first cover latch/lift subassembly 72 which is part of a cover latch/lift assembly 272 for latching the cover 50 onto and lifting the cover away from the body 10 of the cart 6. Each first cover latch/lift subassembly 72 includes a roller 74 which is rotatably supported by and rotatable about an axle 82, as well as a slot 78. These first cover latch/lift subassemblies 72 are appropriately mounted on the frame 58 in a manner such that both the roller 74 and slot 78 downwardly extend entirely through an aperture 62 formed on the frame 58 and through an aligned aperture 56 which extends entirely through the plate 54 (i.e., the roller 74 and slot 78 of each of the first cover latch/lift subassemblies 72 are disposed or extend "below" the cover 50). When mounted on the body 10 of the cart 6, each roller 74 and slot 78 also extend downwardly through an aligned roller aperture 20 in one of the cover support plates 19 so as to extend below such cover support plate 19. Two first cover latch/lift subassemblies 72 are disposed on one pair of opposite sides of the cover 50 in the illustrated embodiment to facilitate removal of the cover 50 form the body 10, although more or less could be utilized. Selection of an appropriate configuration for the rollers 74 may allow at least one first cover latch/lift subassembly 72 to be disposed on each side of the cover 50 (not shown).

Each first cover latch/lift subassembly 72 is engageable by a second cover latch/lift subassembly 328 of the cover latch/lift assembly 272. Refer now to FIGS. 11A–11D. Generally, the plurality of second cover latch/lift subassemblies 328 (one provided for each first cover latch/lift subassembly 72) is moved between at least two positions to provide the latching and lifting functions. This movement is provided by a pair of latch/lift assembly linkages 300 of the cover latch assembly 272 which are disposed on opposing sides of the cart 6.

Only one latch assembly linkage 300 will be described since each is similarly structured. The latch assembly linkage 300 includes a first link 304, a second link 308, a third link 312, and a fourth link 316. The first link 304 is pivotally interconnected with a mounting bracket 280 by a latch assembly linkage-handle pivot pin 320. The mounting bracket 280 in turn is fixedly attached to a handle 276 for the cart 6, which is in turn pivotally interconnected with the body 10 of the cart 6 by a handle-cart pivot pin 284. The first link 304 includes a slot 306 in which a pivot pin 318a travels and which pivotally interconnects the first link 304 and its corresponding second link 308.

The second link 308 of a given second latch/lift subassembly 328 is pivotally interconnected with the body 10 of the cart 6 by a latch assembly linkage-cart body pivot pin 324. The second link 308 is further pivotally interconnected with the third link 312 by a pivot pin 318b. The third link 312 is also pivotally interconnected with the fourth link 316 by a clevis pin 352 from one of the second latch/lift subassemblies 328. Each clevis pin 352 pivotally interconnects one of the second latch/lift subassemblies 328 with its corresponding latch assembly linkage 300. As such, the other second latch/lift subassemblies 328 is similarly pivotally interconnected with its corresponding fourth link 316 by a clevis pin 352 as well.

Each of the second latch/lift subassemblies 328 includes a first clevis 332a and a second clevis 332b which are pivotally interconnected by the above-noted clevis pin 352. A lift roller 340 is also pivotally interconnected with each of the clevis 332a and clevis 332b by the clevis pin 352. The lift roller 340 is further pivotally interconnected with the body 10 of the cart 6 by a bushing 348. A latch 336 is attached to the lift roller 340 by a plurality of fasteners 344 which extend through elongated slots 338 on the latch 336 to provide adjustment capabilities.

Figure 11A:
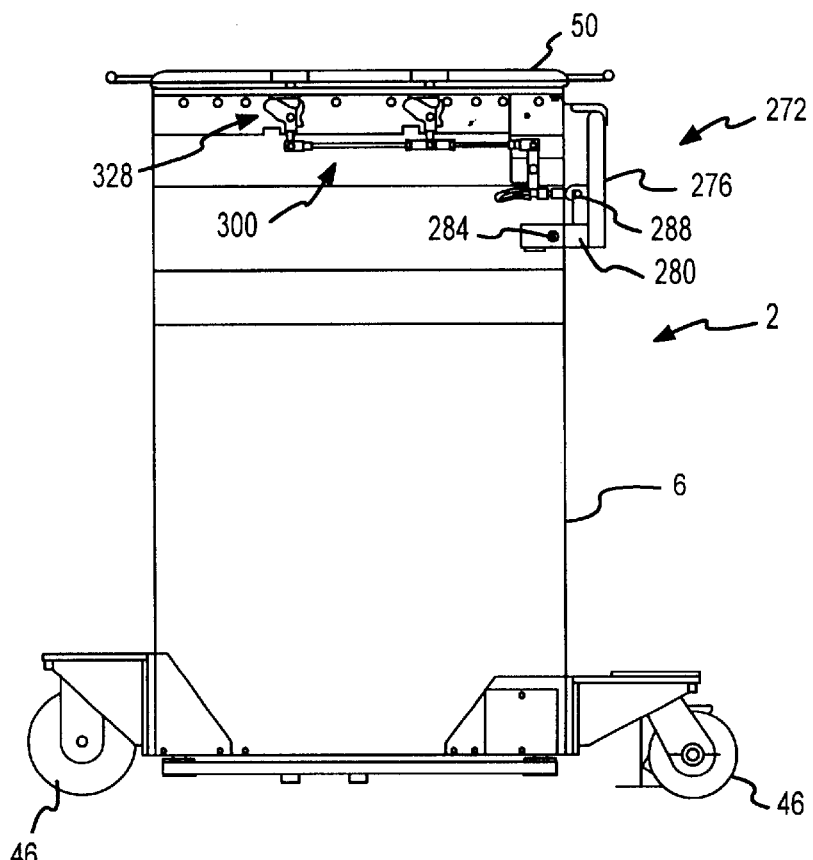
FIG. 11A is a side view of the material delivery system of FIG. 1 which illustrates in more detail the cover latch/lift assembly.
Figure 11B:
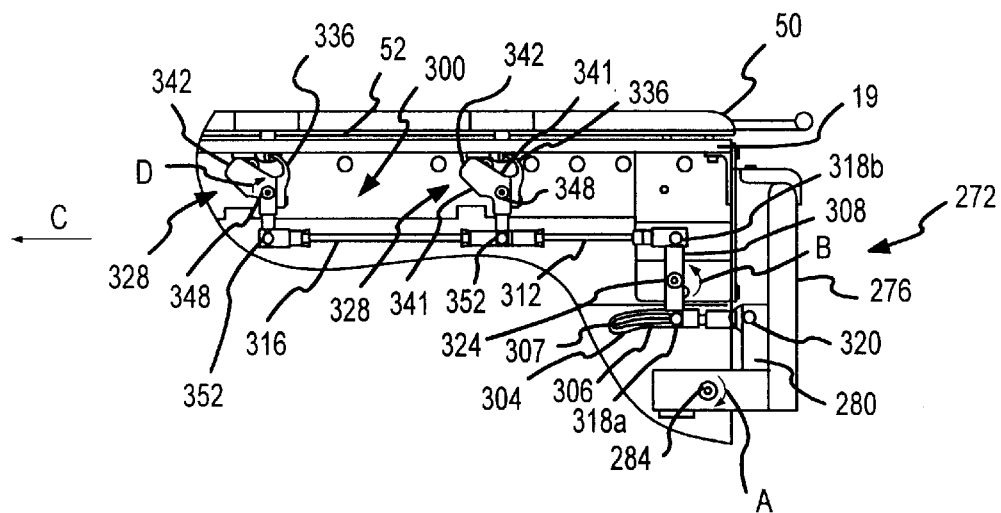
FIG. 11B is enlarged, side view of the cover latch/lift assembly presented in FIG. 11A.
Figure 11C:
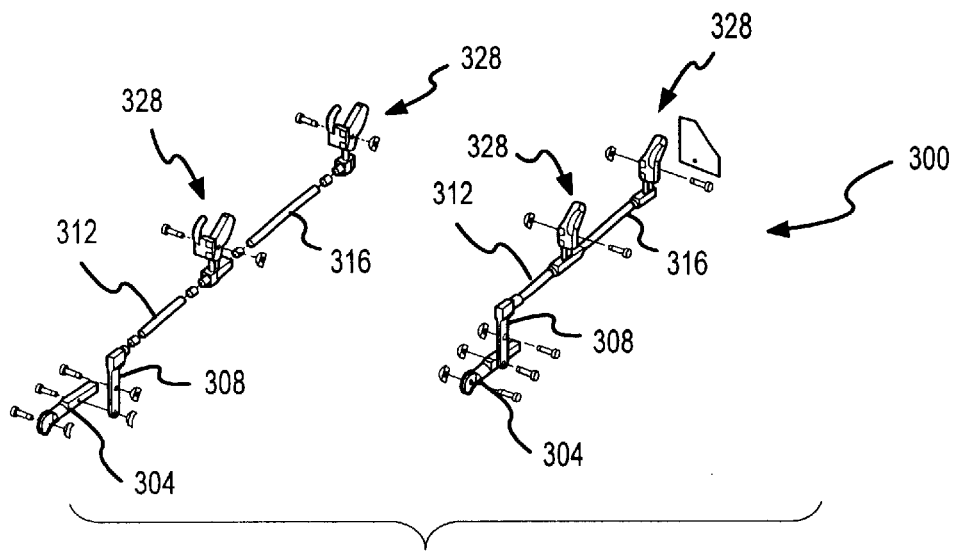
FIG. 11C is an exploded, enlarged perspective view of the pair of latch/lift assembly linkages used by the cover latch/lift assembly of FIG. 11A.
Figure 11D:
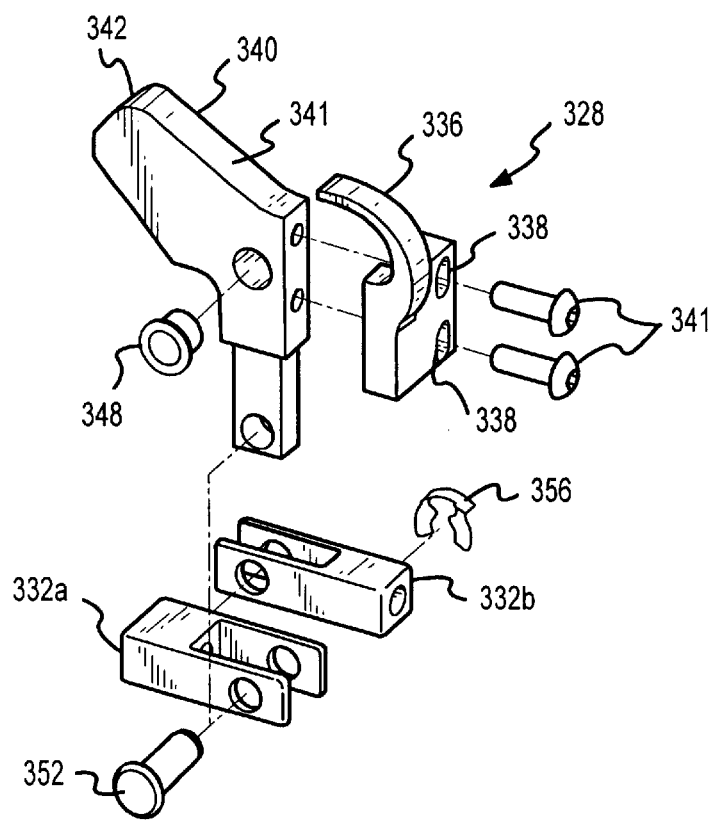
FIG. 11D is an exploded, enlarged perspective view of a second latch/lift subassembly of the cover latch/lift assembly which is interconnected with the linkages presented in FIG. 11C and further which interfaces with the first latch/lift subassembly presented in FIG. 10D to provide the latching and lifting functions for the cover.

When the handle 276 is disposed in the position illustrated in FIG. 11B, each latch 336 of a second latch/lift subassembly 328 is disposed in the slot 78 of its corresponding first latch/lift subassembly 72 to retain the cover 50 on the body 10 of the cart 6. Subsequent movements of the cover latch/lift assembly 272 will principally be directed to FIG. 11B and for purposes of unlatching and then lifting the cover 50, although other drawings may be consulted. When it is desirable to remove the cover 50 to access the upper chamber 28 of the enclosed space 26, the handle 276 is pivoted in the direction of the arrow A. A certain degree of movement of the handle 276 in this direction has no substantial effect on the position of either of the latch/lift assembly linkages 300 due to the slot 306 in each of the first links 304. Engagement of the pins 318a against an end 307 of the slots 306 will then cause each of the first links 304 to simultaneously pivot relative to the body 10, which in turn simultaneously pivots each of the second links 308 in the direction of the arrow B. Pivotation of the second links 308 in the direction of the arrow B in turn causes the corresponding third links 312 and fourth links 316 of each of the latch/lift assembly linkages 300 to move at least generally axially in the direction of the arrow C. This movement of the third links 312 and fourth links 316 causes the second latch/lift subassemblies 328 interconnected therewith to simultaneously pivot in the direction of the arrow D. Each latch 336 is removed from its corresponding slot 78 by this motion of the second latch/lift subassemblies 328. This motion also directs each of the lift rollers 340 upwardly into engagement with their corresponding roller 74 to "lift" the rollers 74 out of its corresponding roller aperture 20 formed in the cover support plates 19 along an at least substantially vertical path so as to dispose the lower surface of the rollers 74 in at least substantially co-planar relation with the upper surface of the cover support plates 19. In this regard, the second latch/lift subassemblies 328 are pivoted so as to dispose an at least substantially flat surface 341 of each lift roller 340 in at least substantially co-planar relation with the upper surface of the cover support plates 19. As such, there is a relatively smooth surface for rolling the cover 50 off of the body 10 of the cart 6. Having 2 or more second latch/lift subassemblies 328 on a pair of opposing sides of the cover 50 provides a certain stability during this movement (e.g., reduces the potential for a "teeter-totter" effect). When it is desired to reinstall the cover 50 on the body 10 and with the cover latch/lift assembly 272 being in the last referenced position, the handle 276 may be pivoted in the opposite direction to that noted above to move each of the components of the cover latch/lift assembly 272 in the opposite direction to that presented above to reinstall the latch 336 of each second latch/lift assembly 328 in the slot 78 of the corresponding first latch/lift subassembly 72. At this time, the handle 276 also of course may be used to push the cart 6 for transportation of the same to another locale.

The material delivery system 2 may be used to provide parts to a station for assembly and/or processing of some kind. One embodiment of such an application is illustrated in FIG. 12 in the form of a station 400. The station 400 includes a table 404 which has a plurality of apertures 408 through which trays 428 stacked within a material delivery system 424 may be disposed. That is, the material delivery system 424 is disposed below the table 404 or at a lower elevation that a work surface of the table 404. In the illustrated embodiment, the material delivery system 424 is not a portable unit, but is instead fixedly interconnected with the station 400. However, the material delivery system 424 includes all other relevant features of the material delivery system 2 discussed above (e.g., a material delivery elevator 100). Part transfer robot 412 many remove one or more parts from one or more of the trays 428 to provide the same to a turntable 416 where such parts may be acted upon by an operator, an assembly robot 420, or both. For instance, the station 400 may be used to assembly an actuator arm assembly stack for a disk drive device.

Another embodiment of an application which may utilize the above-noted principles is illustrated in FIG. 13 in the form of a station 432. The station 432 includes a table 436 which has a plurality of apertures 440 through which trays 460 stacked within a material delivery system 456 may be disposed. Again, the material delivery system 456 is disposed below or underneath the table 436 in a similar to the FIG. 12 embodiment. In the illustrated embodiment of FIG. 13, however, the material delivery system 456 is generally the same as the material delivery system 2 discussed above, and is thereby a portable unit unlike that presented in FIG. 12. Part transfer robot 444 may remove one or more parts from one or more of the trays 460 to provide the same to a turntable 448 where such parts may be acted upon by an operator, an assembler 452, or both. For instance, the station 432 may be used to assemble certain parts of a disk drive device.

The material delivery system 2 is particularly adapted for use in filtered environments, including without limitation clean rooms and minienvironments. One embodiment of a minienvironment 464 is presented in FIG. 14. The minienvironment 464 includes a frame 468 and an enclosure 470 which defines a material handling zone or workstation in an enclosed space 476. One or more transparent panels 484 may define at least a portion of the enclosure 470, and one or more accesses 472 may exist within the enclosure 470 to provide access to the enclosed space 476. The minienvironment 464 further includes an air flow system 480 for directing filtered air into the enclosed space 476 in a manner which maintains cleanliness at a desired level. A more detailed discussion of minienvironments is presented in U.S. Pat. No. 5,487,768, which issued on Jan. 30, 1996, and the entire disclosure of which is incorporated by reference in its entirety herein.

Figure 14:
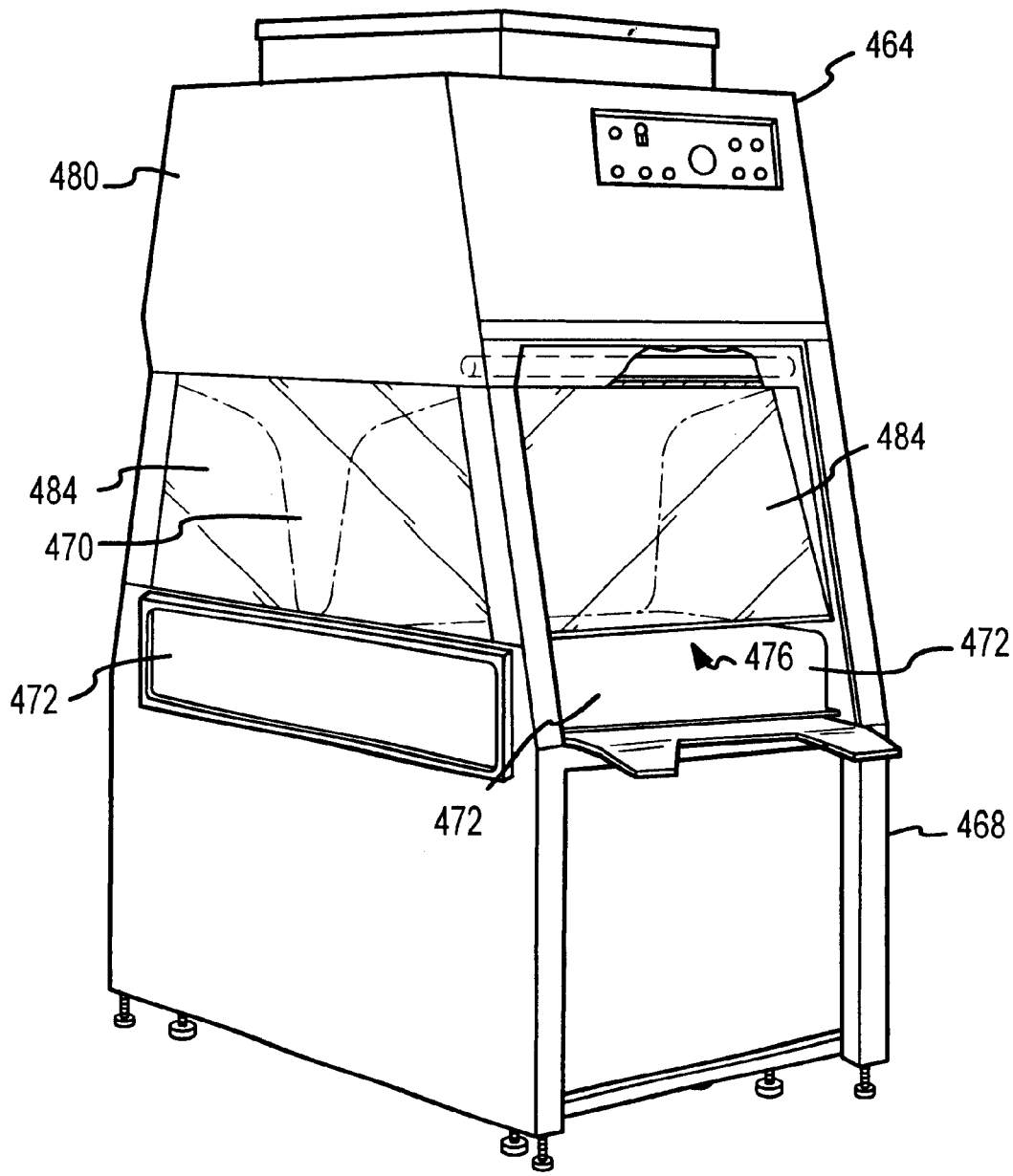
FIG. 14 is one embodiment of a minienvironment with which any of the above-noted material delivery systems may be used.

Either of the stations 400 or 432 (FIGS. 12–13) may be used in combination with the minienvironment 464 of FIG. 14, although certain adaptations may be required. Moreover, each of the stations 400, 432 may be disposed in a clean room. Clean rooms or minienvironments typically have at least a certain air quality via appropriate filtering, and the use of the material delivery systems disclosed herein does not significantly affect this air quality. In this regard, the filtered environments in which the material delivery system 2 is particularly adapted for use therewith have a low contamination per unit volume, and the material delivery systems doe not have a substantial adverse effect on the cleanliness levels of such environments. Another way of characterizing these filtered environments is in reference to Federal Standard 209. The material delivery system 2 may be used in a Class 100 environment or cleaner without significantly affecting the air quality. When sealed, the material delivery systems disclosed herein themselves are capable of maintaining a Class 10 environment.

Figure 15:
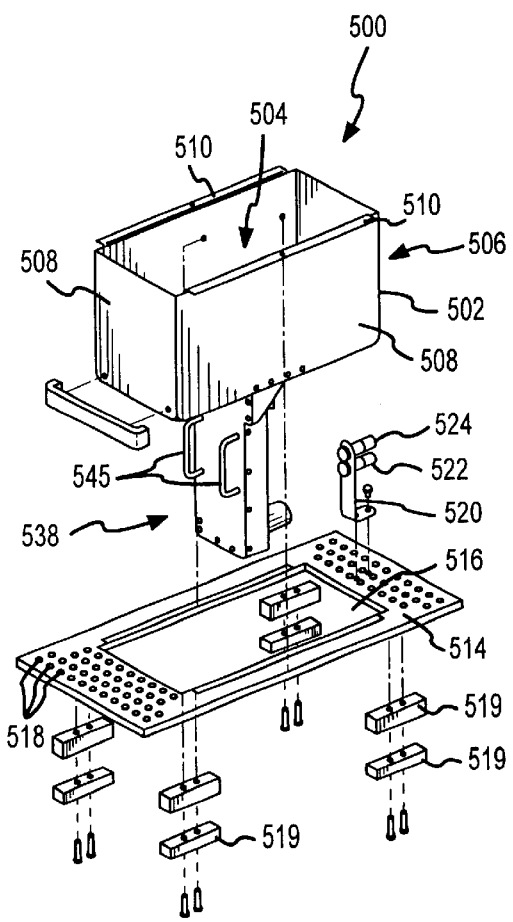
FIG. 15 is an exploded, perspective view of another embodiment of a material delivery system.
Figure 16:
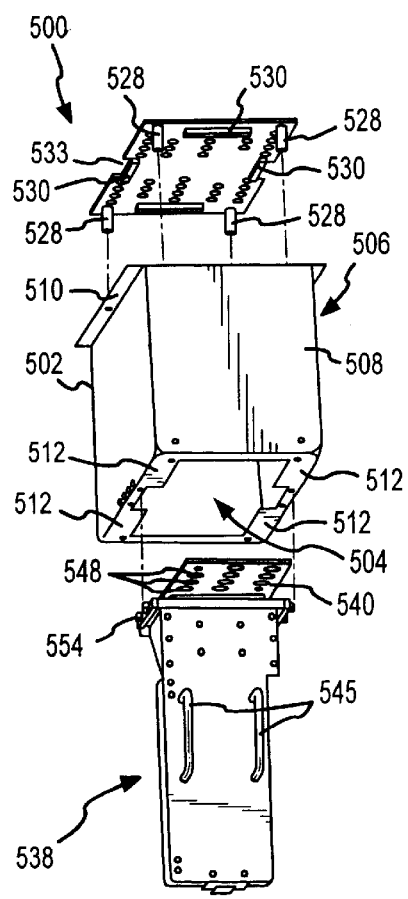
FIG. 16 is another perspective view of the material delivery system of FIG. 15.

Another embodiment of a material delivery system 500 is illustrated in FIGS. 15–16, and such may be used at any work station in a filtered environment, including within a clean room and in a minienvironment. The material delivery system 500 generally includes a housing 502 and an elevator assembly 538. A container platform 526 is disposed within a hollow interior 504 of the housing 502 and is movable relative thereto. At least one and more preferably multiple containers may be stacked on this container platform 526 for storage within the hollow interior 504 of the housing 502 until needed at the workstation. The elevator assembly 538 is utilized to move the container platform 526 within the hollow interior 504 of the housing 502 to a desired/required vertical position, including to present an uppermost container that is on the container platform 526 for presentation to an operator at a workstation which incorporates the material delivery system 500 at a desired elevation. One desirable feature of the material delivery system 500 is that movement of the elevator assembly 538 is automatically controlled by monitoring for the presence/absence of a container at two different vertical positions (i.e., at different elevations). Another desirable feature of the material delivery system 500 is that an interconnection between the elevator assembly 538 and the housing 502 does not require any tools for establishing/maintaining this interconnection. Yet another desirable feature of the material delivery system 500 is that containers need not be removed from the container platform 526 prior to disconnecting elevator assembly 538 from the housing 502.

The housing 502 of the material delivery system 500 is defined by a sidewall assembly 506. This sidewall assembly 506 is disposed entirely or circumferentially about a reference point or axis to provide a continuous perimeter for the housing 502. Multiple panels 508 are appropriately interconnected to define the housing 502. Any appropriate construction could be utilized for the sidewall assembly 506. A bottom lip 512 is disposed on a lower portion of the housing 502 and extends at least generally horizontally inwardly from the sidewall assembly 506 a limited amount. The bottom lip 512 may be an annular structure or as shown (e.g., intermittent). Any way of forming/defining the bottom lip 512 may be utilized. An upper lip 510 is disposed on opposite sides of an upper portion of the housing 502 and extends at least generally horizontally outwardly from the top of the housing 502. The upper lip 510 could also be annular if desired/required.

The material delivery system 500 further includes a top plate 514 that may be interconnected with a workstation that incorporates the material delivery system 500. Typically, the top plate 514 of the material delivery system 500 will be disposed at least generally coplanar with the work surface of any such workstation. For instance, the top plate 514 would typically be disposed at least generally parallel with the table 404 if the system 500 is utilized by the station 400 of FIG. 12, or at least generally parallel with the table 436 if the system 500 is utilized by the station 432 of FIG. 13.

The top plate 514 includes a central aperture 516 that is configured or adapted to receive the housing 502. The material delivery system 500 is specifically adapted for use in a clean or filtered environment. Typically these environments use an at least generally downwardly directed flow of an appropriate fluid to maintain the cleanliness at the desired level. The material delivery system 500 does not have a significantly adverse effect on the cleanliness level. In this regard, the top plate 514 includes plurality of apertures 518 so as to not significantly affect this generally downwardly directed flow. The material delivery system 500 may be used in a filtered environment having a contamination levels at least comparable to the material delivery system 2 of FIGS. 1–2 discussed above (at least as clean as a Class 100 environment in accordance with Federal Standard 209).

The upper lip 510 of the housing 502 is disposed in overlying relation to a portion of the top plate 514 when the housing 502 is inserted down through its central aperture 516. The top plate 514 may thereby support the housing 502. A plurality of housing supports 519 may also be fastened to the lower side of the top plate 514 to provide additional support to the housing 502 as well. The top plate 514 defines an upper end of the material delivery system 500. As noted above, one particularly desirable aspect of the material delivery system 500 is that the movement of the elevator assembly 538 is controlled by monitoring for the existence of containers at multiple vertical positions. In the illustrated embodiment both of these vertical positions are disposed beyond the upper end of material delivery system 500. In this regard, a monitor support 520 is attached to and extends vertically upward from the top plate 514. A pair of container monitors or sensors 522, 524 are installed on the support 520 for sensing for the existence of a container at two different vertical positions. How the elevator assembly 538 is actually moved in response to an output from these container sensors 522, 524 will be discussed in more detail below in relation to FIGS. 22–28. Generally, the first container monitor 522 controls the upward movement of the elevator assembly 538 (e.g., monitor 522 sends a signal to the elevator assembly 538 when it does not detect the presence of a container at a certain vertical position to initiate an upward movement), while the second monitor 524 controls the downward movement of the elevator assembly 538 (e.g., monitor 524 sends a signal to the elevator assembly 538 when it does detect the presence of a container at a different vertical position to initiate a downward movement).

Figure 17:
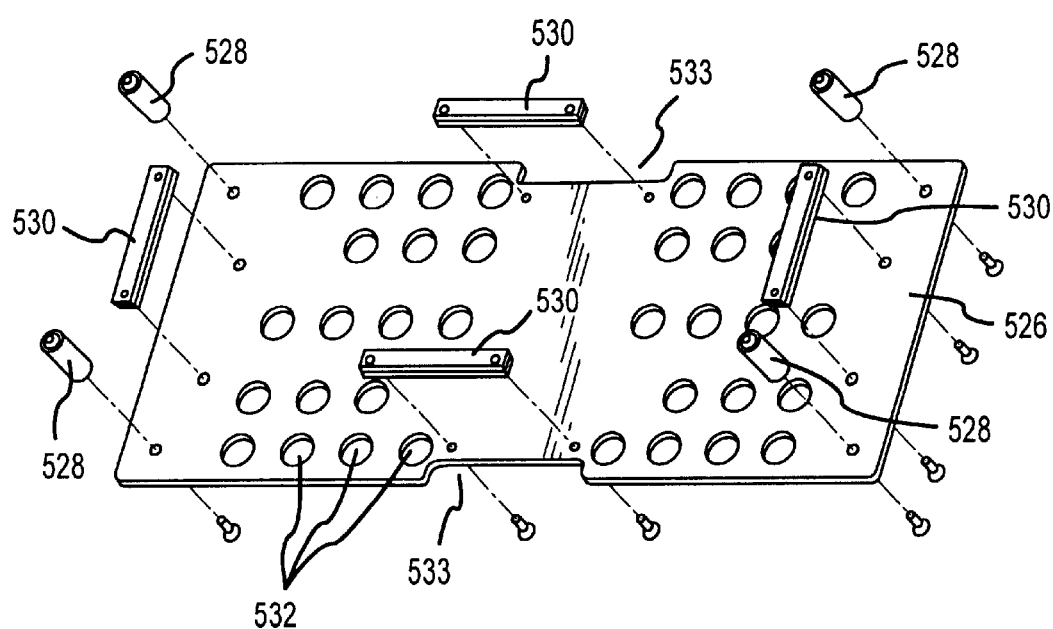
FIG. 17 is an exploded, perspective view of a container platform used by the material delivery system of FIG. 15.

The container platform 526 again is disposed in the hollow interior 504 of the housing 502 for supporting containers thereon. Multiple platform apertures 532 extend through the container platform 526 to account for the downwardly directed flow in a filtered environment. Movement of the container platform 526 to the desired/required position is physically provided by the elevator assembly 538. The elevator assembly 538 interfaces with the container platform 526 on a lower surface thereof and interiorly of a plurality of elevator drive guides 530 that are fastened to this lower surface. However, the container platform 526 is not actually mechanically fixed to the elevator assembly 538, but instead by gravity, which allows the elevator assembly 538 to be disconnected from the housing 502 without unloading the material delivery system 500 (i.e., without having to take off any containers that are stacked on the container platform 526 when disposed within the hollow interior 504 of the housing 502). In this regard and referring now as well to FIG. 17, the container platform 526 includes a plurality of legs or setoffs 528 that are fastened to the lower side of the container platform 526 and extend downwardly therefrom when the container platform 526 is installed within the hollow interior 504 of the housing 502 in the required manner. These setoffs 528 cooperate with the bottom lip 512 that is interconnected with the housing 502 to limit the downward movement of the container platform 526 relative to the housing 502. That is, once the elevator assembly 538 has lowered the container platform 526 to a position where the setoffs 528 engage an aligned portion of the bottom lip 512, any further downward movement of the elevator assembly 538 will not have an effect on the vertical position of the container platform 526 relative to the housing 502. This allows the container platform 526 to be supported by the housing 502 versus the elevator assembly 538, that in turn allows the elevator assembly 538 to be disconnected from the housing 502 without having to unload the material delivery system 500 of its containers.

Figure 18A:
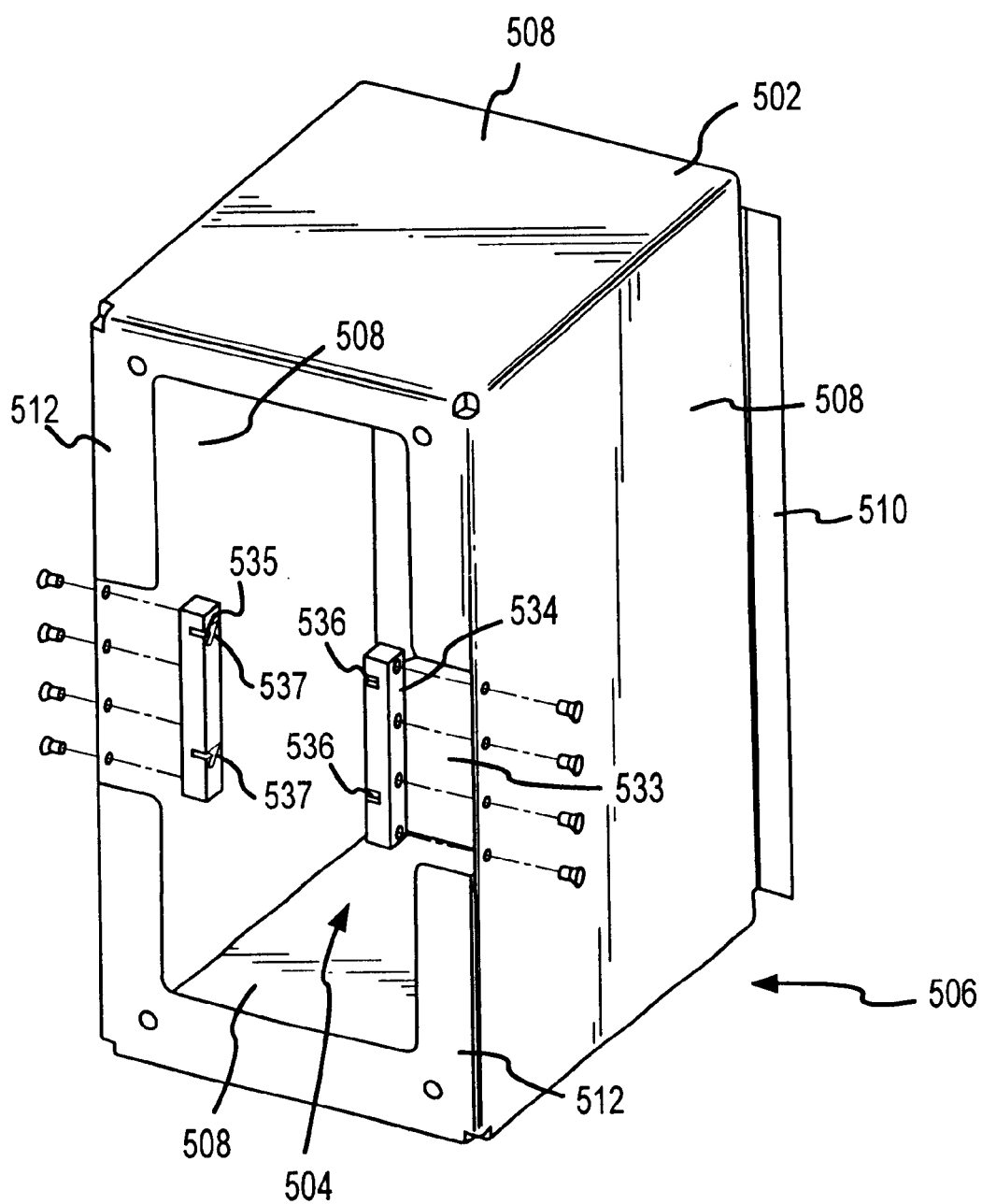
FIG. 18A is an exploded, perspective view of a lower portion of a housing used by the material delivery system of FIG. 15, and which illustrates a pair of mounting blocks that are used to interconnect an elevator assembly of the material delivery system with the housing.
Figure 18B:
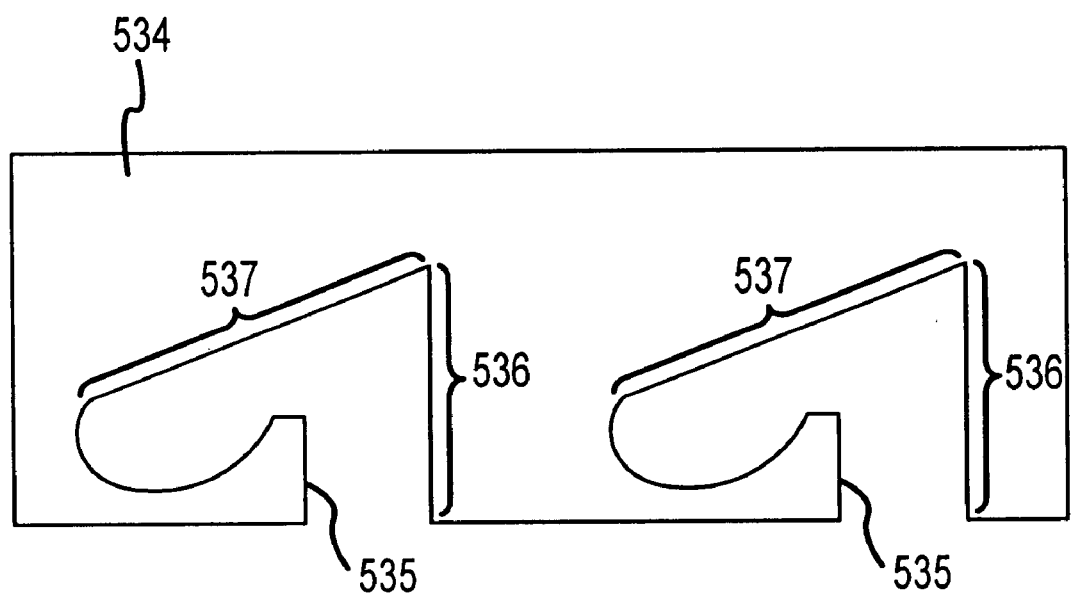
FIG. 18B is a side view of one of the mounting blocks of FIG. 18A.

The elevator assembly 538 and housing 502 are interconnected in a manner which does not require any tools for installation or removal. In this regard and referring now to FIGS. 16, 18A, and 18B, a pair of mounting blocks 534 are appropriately interconnected with opposite sides of the housing 502. These mounting blocks 534 may be positioned within a pair of opposing recesses 533 that exist within the bottom lip 512. However, the mounting blocks 534 could be disposed at other locations. Each mounting block 534 includes a pair of mounting slots 535 that may be adapted to slidably receive interconnecting structure from the elevator assembly 538. FIG. 18B is a plan view of one of these mounting blocks 534 that illustrates the shape of the mounting slots 535. A first portion 536 of each slot 535 extends at least generally upwardly when the associated mounting block 534 is installed on the housing 502, and is accessible from below for installing/removing the elevator assembly 538. A second portion 537 of each slot 535 extends at least generally downwardly from an upper extreme of its corresponding first portion 536, and further in a lateral direction as well. This allows purely gravitational forces to maintain the interconnection between the elevator assembly 538 and the housing 502.

Figure 19:
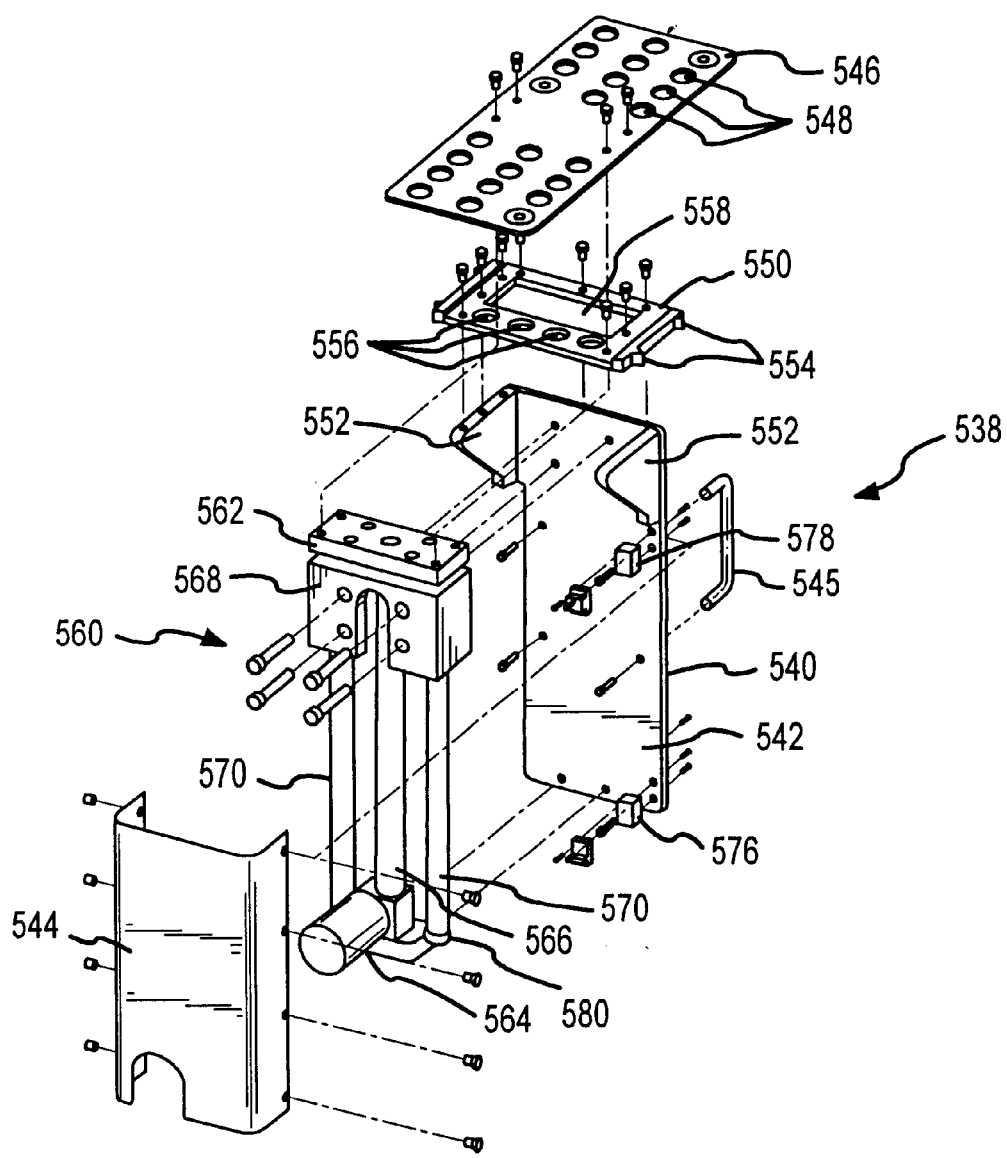
FIG. 19 is an exploded, perspective view of the elevator of FIG. 15.
Figure 20:
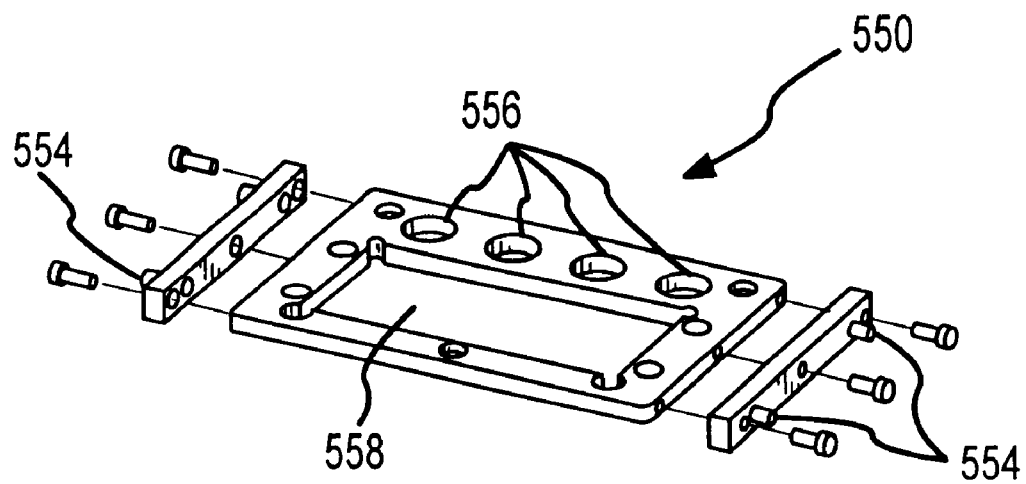
FIG. 20 is an exploded view of a mounting plate and pins of the elevator assembly for interconnecting the same with the housing via the mounting blocks of FIGS. 18A–B.

FIG. 19 is an exploded, perspective view of the elevator assembly 538 used by the material delivery system 500 of FIGS. 15–16. The elevator assembly 538 generally includes an elevator housing 540 that is interconnected with the housing 502 through the above-noted mounting slots 535. The elevator housing 540 generally includes a front panel 542 and a rear panel 544 that are interconnected in any appropriate manner. A pair of handles 545 are attached to the front panel 542 to facilitate installation and removal of the elevator assembly 538 in relation to the housing 502. The elevator housing 540 also includes a mounting plate 550 that is attached to a pair of supports 552, that in turn are appropriately interconnected with an interior surface of the front panel 542. The mounting plate 550 includes a pair of mounting pins 554 that are disposed on opposite sides of the plate 550 as illustrated in FIGS. 16 and 19–20. The plurality of mounting pins 554 extend at least generally horizontally outward from the mounting plate 550. The mounting plate 550 also may include a plurality of mounting plate apertures 556 to account for the downwardly directed flow in a filtered environment. These mounting pins 554 cooperate with corresponding mounting slots 535 on the housing 502 to interconnect the elevator assembly 538 and the housing 502 in a manner that does not require any tools for either installation or removal.

Figure 21A:
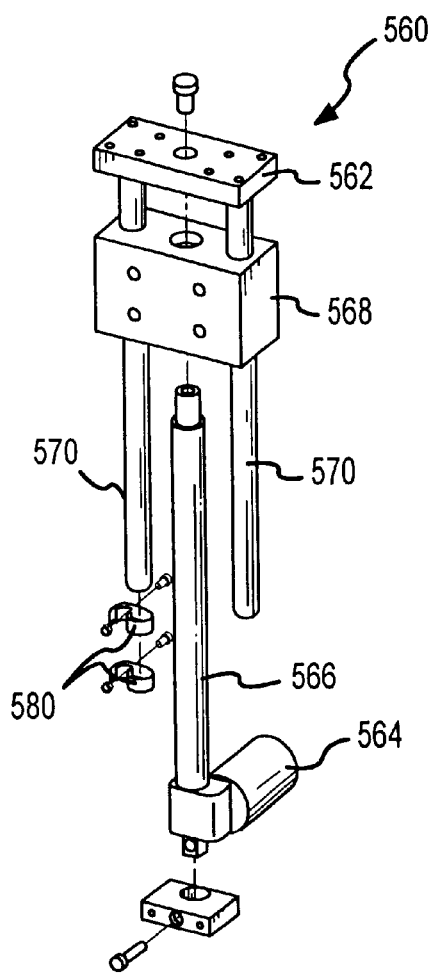
FIG. 21A is an exploded, perspective view of an elevator drive assembly.
Figure 21B:
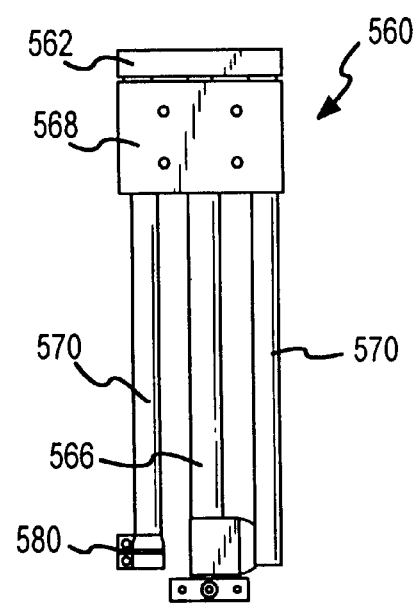
FIG. 21B is a plan view of the elevator drive assembly of FIG. 21A.

The elevator assembly 538 also includes an elevator drive assembly 560 that is appropriately attached with the elevator housing 540 and that is illustrated in FIGS. 19 and 21 A–B. Components of the elevator drive assembly 560 include an elevator platform 546 and a drive platform 562 that is interconnected with this elevator platform 546. The elevator platform 546 includes a plurality of apertures 548 so as to account for the downwardly directed flow in a filtered environment in the manner discussed above. The mounting plate 550 of the elevator housing 540 has a central aperture 558 that allows the drive platform 562 to extend therethrough and interconnect with the elevator platform 546 in any appropriate manner. Therefore, the drive platform 562 and elevator platform 546 may move relative to the mounting plate 550, which again establishes the interconnection of the elevator assembly 538 with the housing 502.

Movement of the elevator platform 546 and drive platform 562 is provided through operation of a motor 564 that is appropriately interconnected with a lead or drive screw rod assembly 566. Both the motor 564 and drive screw rod assembly 566 are thereby part of the elevator drive assembly 560. The drive screw rod assembly 566 extends through a guide bushing housing 568 of the elevator drive assembly 560 and is interconnected with the drive platform 562. A pair of guide rods 570 of the elevator drive assembly 560 slidably interface with the guide bushing housing 568 extend upwardly therethrough for connection with the drive platform 562, which again is interconnected with the elevator platform 546. Thus, by having the motor 564 rotate the drive screw rod assembly 566, the drive platform 560 and elevator platform 546 are simultaneously raised or lowered, depending upon the direction of rotation of the motor 564. Movement of the drive platform 560 and elevator platform 546 is stabilized by the guide rods 570 that slide through the guide bushing housing 568.

Upward movement of the drive platform 560 and the elevator platform 546 will eventually move the elevator platform 546 into engagement with the lower surface of the container platform 526. At this time the elevator platform 546 is disposed between the elevator drive guides 530 on the bottom side of the container platform 526 to help provide more control and stability during operation. Movement of the elevator platform 546 is automatically controlled by the container sensors 522, 524 as generally noted above and as will be discussed in more detail below in relation to FIGS. 22–28. Other sensors may be utilized by the material delivery system 500 as well. For instance, a bottom elevator position sensor 576 and top elevator position sensor 578 may also be fastened to the interior of the front panel 542 of the elevator housing 540 to stop the elevator platform 546 from extending beyond or below its maximum or minimum limit. In this regard, a stop trigger 580 is interconnected with at least one of the guide rods 570. When the guide rods 570 have reached their maximum elevation, the stop trigger 580 may operatively interface with the top elevator position sensor 578 to discontinue any further upward travel of the elevator platform 546 by sending an appropriate signal to the motor 564. Similarly, the stop trigger 580 may operatively interface with the bottom elevator position sensor 576 to discontinue any further downward travel of the elevator platform 546 by sending an appropriate signal to the motor 546.

Based upon the preceding discussion, it should be appreciated that the elevator assembly 538 and the housing 502 are interconnected in a manner that does not require any tools for either installation or removal. That is, the elevator assembly 538 is entirely removable from the housing 502. When installing the elevator assembly 538, an installer may grasp the handles 545 and direct the mounting pins 554 of the elevator assembly 538 to align the same with the mounting slots 535 on the bottom of the housing 502. The elevator assembly 538 is then raised such that the mounting pins 554 initially progress through the first portion 536 of their corresponding mounting slot 535. Thereafter the elevator assembly 538 may be moved laterally to move the mounting pins 554 laterally and downwardly though the second portion 537 of their corresponding mounting slot 535. Gravitational forces will retain the mounting pins 554 within the lowermost extreme of the second portion 537 of their corresponding mounting slot 535. With the elevator assembly 538 now being removably interconnected with the housing 502 as above-described, the elevator platform 546 of the elevator assembly 538 will be in proper position to raise or lower the container platform 526 in the desired/required manner. Removal of the elevator assembly 538 simply entails reversing the above-noted protocol.

Reference should now be made to FIGS. 22–28 which illustrate the controlled movement of the container platform 526 provided by the material delivery system 500. As noted above, the container monitors 522 and 524 automatically control the movement of the elevator assembly 538 by determining if a container is at a certain vertical position and sending an appropriate signal to the motor 546. Generally, if the first container monitor 522 determines that there is no container at a certain vertical position, it sends a signal to the elevator assembly 538 to raise the elevator platform 546, and the container platform 526 that is interfaced therewith, one increment. Conversely, if the second container monitor 524 determines that there is container at a certain, different vertical position, it sends a signal to the elevator assembly 538 to lower the elevator platform 546, and the container platform 526 that is interfaced therewith, one increment. The extent of the "increment" may be input to the elevator assembly 538 to correspond with the height of the container typically used therewith.

Figure 22:
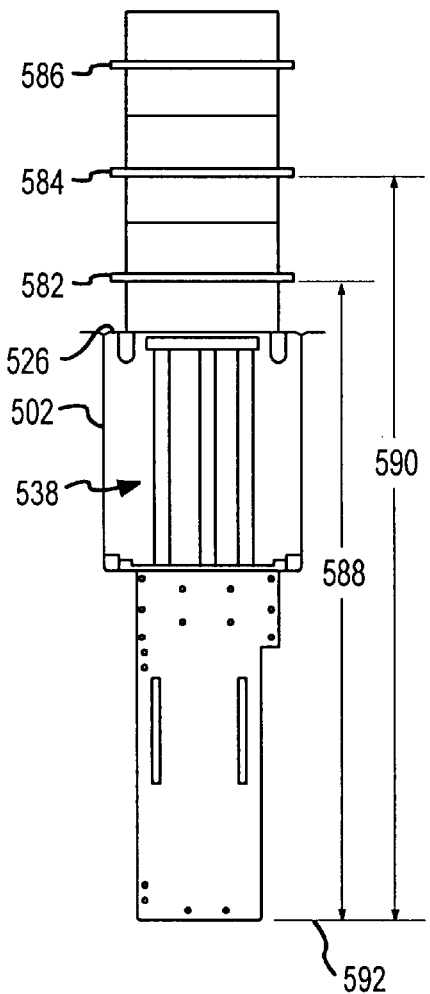
FIG. 22 is a cutaway, side view of the material delivery system of FIG. 15 immediately after a plurality of component trays have been stacked on the elevator.
Figure 23:
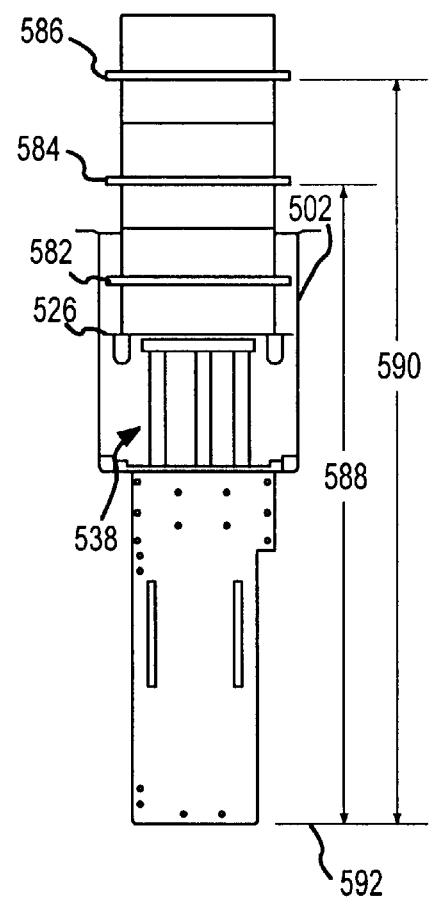
FIG. 23 is a cutaway, side view of the material delivery system of FIG. 15 after the elevator has been lowered one vertical increment after the stacking operation of FIG. 22.

FIG. 22 illustrates the container platform 526 loaded with a first component tray 582, a second component tray 584, and a third component tray 586. The housing 502 could be sized to accommodate any number of trays. The first component tray 582 is disposed on the container platform 526, the second component tray 584 is positioned on first component tray 582 in a stacked vertical relationship, and the third component tray 586 is stacked on the second component tray 584 in a stacked vertical relationship.

The first container monitor 522 (FIG. 15) monitors a first vertical position 588 for controlling the upward movement of the elevator assembly 538. The first vertical position 588 corresponds with the desired vertical position of a container or component tray for unloading by an operator at the work station that utilizes the material delivery assembly 500, or at least roughly flush or coplanar with the work surface. In FIG. 22 this corresponds with the vertical position of the first component tray 582. Although the first vertical position 588 is shown in reference to the vertical midpoint of the first component tray 582, the first vertical position 588 may correspond with any vertical position that corresponds with the height of the first component tray 582 in FIG. 22.

The second container monitor 524 monitors a second vertical position for controlling the downward movement of the elevator assembly 538. The second vertical position 590 corresponds with the vertical position of the second component tray 584 in FIG. 22. Although the second vertical position 590 is shown in reference to the vertical midpoint of the second component tray 582 in FIG. 22, the second vertical position 590 may correspond with any vertical position that corresponds with the height of the second component tray 582 in the position illustrated in FIG. 22. Both the first vertical position 588 and second vertical position 590 are measured relative to common reference plane 592, with the second vertical position 590 thereby being at a higher elevation than the first vertical position 588 relative to the reference plane 592, as well as in relation to the upper end of the housing 502 for that matter.

In the arrangement shown in FIG. 22, the container platform 526 is fully loaded for the size of the housing 502 and the component trays 582, 584, 586 extend vertically above/beyond the uppermost end of the housing 502. Thus, the first component tray 582 will be detected in the first vertical position 588 by the first container monitor 522, and the second component tray 584 will be detected in the second vertical position 590 by the second container monitor 524. Because a component tray has been detected at the second vertical position 590, the container platform 526 is lowered one vertical increment to the position illustrated in FIG. 23. Here now only the second component tray 584 and the third component tray 586 extend beyond of the housing 502. In this arrangement, now the second component tray 584 is detected at the first vertical position 588 by the first container monitor 522, and the third component tray 586 is detected at the second vertical position 590 by the second container monitor 524. Again, because a component tray has been detected at the second vertical position 590 by the second container monitor 524, the container platform 526 is lowered one vertical increment to the position illustrated in FIG. 24.

Figure 24:
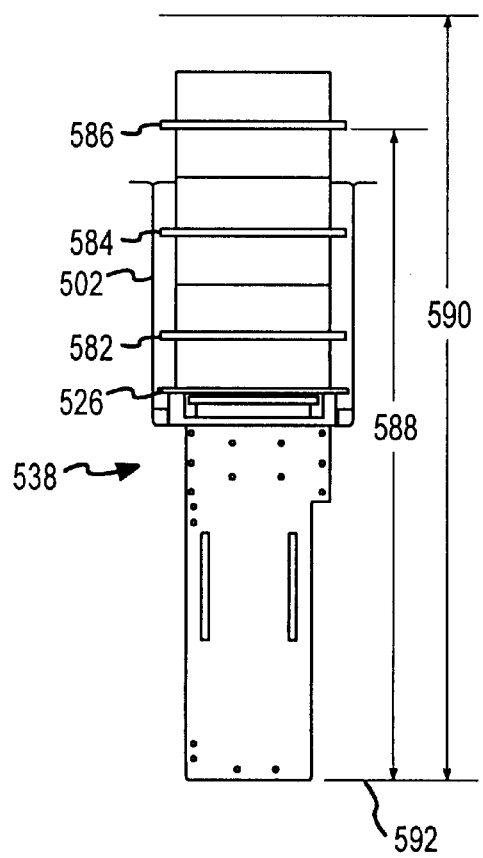
FIG. 24 is a cutaway, side view of the material delivery system of FIG. 15 after the elevator has been lowered another vertical increment to dispose the elevator in the fully loaded position, which allows the operator ready access to the uppermost component tray.

In the position of FIG. 24, the first and second component tray 582, 584 are disposed down within the hollow interior 504 of the housing 502, while the third component tray 586 extends beyond the housing 502 for a desired ergonomic presentation to an operator at the workstation that incorporates the material delivery system 500. Since the second container monitor 524 no longer detects a component tray at the second vertical position 590, the second container monitor 524 will not signal the elevator assembly 538 to move down one vertical increment. Moreover, the third component tray 586 will be detected in the first vertical position 588 by the first container monitor 522. Therefore, the first container monitor 522 also will not initiate an upward movement of the elevator assembly 538 at this time either. Therefore, the container platform 526 will remain in the position illustrated in FIG. 24 so long as the third component tray 586 stays positioned on top of the second component tray 584.

Figure 25:
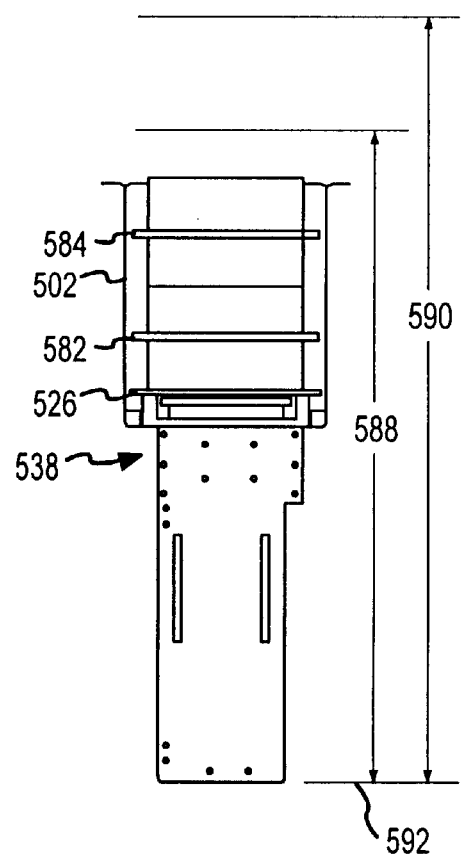
FIG. 25 is a cutaway, side view of the material delivery system of FIG. 15 immediately after the uppermost component tray has been removed.

After the operator at the workstation has removed all of the desired parts from the third component tray 586 or otherwise, the third component tray 586 will be removed from on top of the second component tray 584 to present a condition that is illustrated in FIG. 25. In this case, a component tray will not be detected in either the first vertical position 588 or the second vertical position 590. Since the second container monitor 524 still does not detect a component tray at the second vertical position 590, the second container monitor 524 will not signal the elevator assembly 538 to move down one vertical increment. However, the first container monitor 522 now no longer detects the presence of any component tray at the first vertical position 588. Therefore, the first container monitor 522 sends a signal to the elevator assembly 538 which raises the container platform 526 one vertical increment, such that the second component tray 584 now extends beyond the upper end of the housing 502 as shown in FIG. 26.

Figure 26:
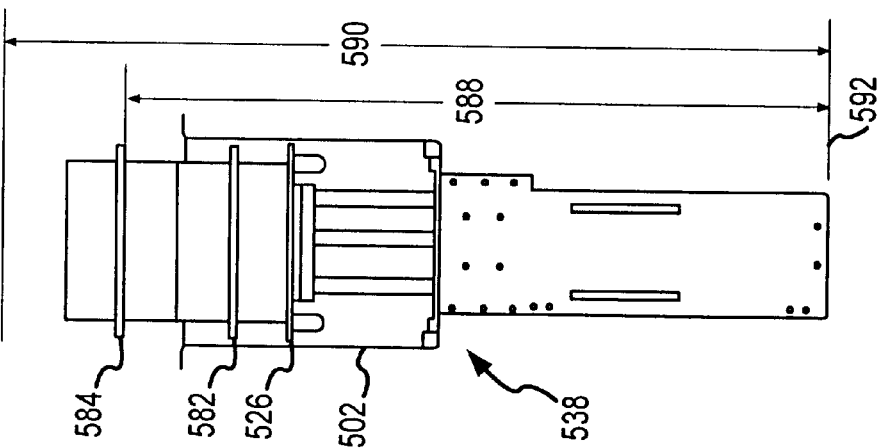
FIG. 26 is a cutaway, side view of the material delivery system of FIG. 15 after the elevator has been raised one vertical increment to present the second component tray for ready access by an operator.

In the position illustrated in FIG. 26, the second container monitor 524 still will not detect any component tray at the second vertical position 590. As such, the second container monitor 524 will not signal the elevator assembly 538 to move down one vertical increment. Moreover, the second component tray 584 will be detected in the first vertical position 588 by the first container monitor 522. Therefore, the first container monitor 522 also will not initiate an upward movement of the elevator assembly 538 at this time either. Therefore, the container platform 526 will remain in the position illustrated in FIG. 26 so long as the second component tray 584 stays positioned on top of the first component tray 582.

Figure 28:
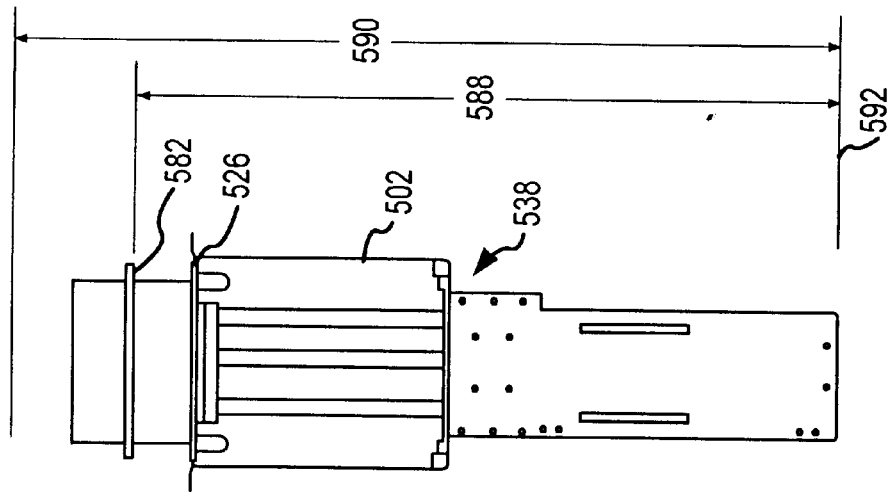
FIG. 28 is a cutaway, side view of the material delivery system of FIG. 15 after the elevator has been raised one vertical increment to present the third component tray for ready at access by an operator.
Figure 27:
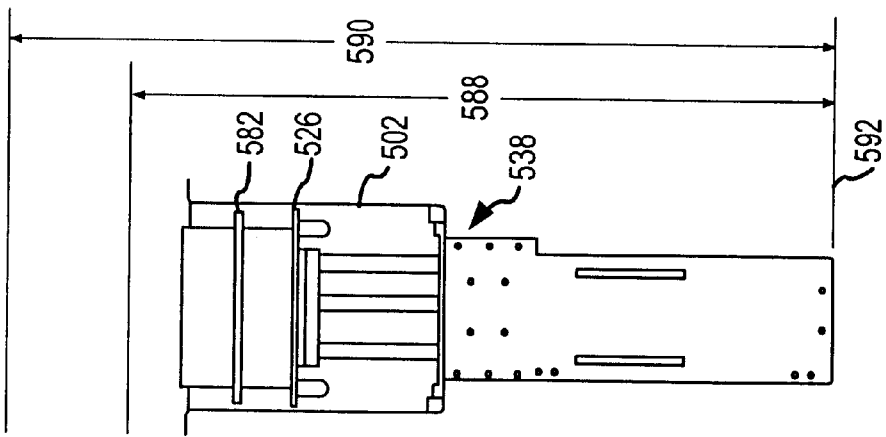
FIG. 27 is a cutaway, side view of the material delivery system of FIG. 15 immediately after the second component tray has been removed.

After the operator at the workstation has removed all of the desired parts from the second component tray 584 or otherwise, the second component tray 584 will be removed from on top of the first component tray 582 to present a condition that is illustrated in FIG. 27. In this case, a component tray will not be detected in either the first vertical position 588 or the second vertical 590. Since the second container monitor 524 still does not detect a component tray at the second vertical position 590, the second container monitor 524 will not signal the elevator assembly 538 to move down one vertical increment. However, the first container monitor 522 now no longer detects the presence of any component tray at the first vertical position 588. Therefore, the first container monitor 522 sends a signal to the elevator assembly 538 which raises the container platform 526 one vertical increment, such that the first component tray 582 now extends beyond the upper end of the housing 502 as shown in FIG. 28.

After the first component tray 582 is removed from the container platform 526, the first container sensor 522 will no longer detect the presence of any component tray at the first vertical position 588. A number of options could be implemented to deal with this situation. Initially, this could initiate a further upward movement of the elevator assembly 538 that could be terminated by the top elevator sensor 578 at a desired "starting" position. Another option would be for the elevator assembly 538 to include a logic that would limit the number of upward incremental advances available for any one cycle, so that even though the first container sensor 522 would no longer sense a component tray at this time, no further upward movements of the elevator assembly 538 would be initiated.

To summarize, in the case of the material delivery system 500, the presence of a component tray at the second vertical position 590 will cause the container platform 526 to be lowered by the second container monitor 524 sending an appropriate signal to the elevator assembly 538. Conversely, the absence of a component tray at the first vertical position 588 will cause the container platform 526 to be raised by the first container monitor 522 sending an appropriate signal to the elevator assembly 538. Preferably, the container platform 526 moves up and down in increments which correspond with the height of the component trays stacked thereon to ultimately present the uppermost component tray at a desired elevation for access by an operator at a workstation that incorporates the material delivery system 500.

The foregoing description of the present invention has been presented for the purposes of illustration and description. Furthermore, the description is not intended to limit the invention to the form disclosed herein. Consequently, variations and modification commensurate with the above teachings, skill, and knowledge of the relevant art, are within the scope of the present invention. The embodiments described hereinabove are further intended to explain the best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A method for assembling a disk drive at a workstation using a material delivery system, wherein said material delivery system comprises an elevator, wherein plurality of containers are stacked on said elevator, wherein each said container comprises a plurality of disk drive components, and wherein said method comprises the steps of:

providing a filtered environment at said workstation;

executing a first monitoring step comprising monitoring for a presence of any said container at a first vertical position;

executing a second monitoring step comprising monitoring for a presence of any said container at a second vertical position;

sending a first signal to said elevator upon said executing a first monitoring step identifying an existence of any said container at said first vertical position;

sending a second signal to said elevator upon said executing a second monitoring step identifying an absence of any said container at said second vertical position;

moving said elevator in a first direction upon receipt of said first signal;

moving said elevator in a second direction upon receipt of said second signal, wherein said first and second directions are opposite;

removing a first said disk drive component from an uppermost said container stacked on said elevator; and assembling at least part of a first disk drive using said first said disk drive component, wherein said assembling step is executed at said workstation.

2. A method, as claimed in claim 1, wherein:

said material delivery system further comprises an elevator housing, wherein said elevator is disposed within said elevator housing, wherein said elevator housing comprises an upper end, and wherein each of said executing first and second monitoring steps are executed at a higher elevation than said upper end of said elevator housing.

3. A method, as claimed in claim 1, wherein:

said first direction is down and is associated with loading said elevator, and wherein said second direction is up and is associated with unloading said elevator.

4. A method, as claimed in claim 1, wherein:

said first direction is a downward direction.

5. A method, as claimed in claim 1, wherein:

said second direction is an upward direction.

6. A method, as claimed in claim 1, further comprising the step of:

loading said plurality of said containers on said elevator in stacked relation, one on top of another, wherein said executing a first monitoring step controls said loading step, wherein said executing a second monitoring step has no effect on said loading step.

7. A method, as claimed in claim 1, further comprising the step of:

unloading said plurality of said containers which are disposed on said elevator in stacked relation, one on top of another, wherein said executing a second monitoring step controls said unloading step, wherein said executing a first monitoring step has no effect on said unloading step.

8. A method, as claimed in claim 1, wherein:

said elevator has a range of travel between first and second vertically spaced positions, wherein said second position is at a higher elevation than said first position, wherein an entirety of both of said executing a first and a second monitoring steps are executed at a higher elevation than said second position.

9. A method, as claimed in claim 1, wherein:

each of said executing first and second monitoring steps comprises directing a beam of light and determining if light of more than a predetermined magnitude is reflected back in a substantially opposite direction used by said directing step.

10. A method, as claimed in claim 1, further comprising the steps of:

loading a first said container on said elevator at a first vertical position, wherein said moving said elevator in a first direction step comprises moving said elevator down a first increment in response to a receipt of said first signal based upon an existence of said first said container at said first vertical position;

loading a second said container on said first said container at said first vertical position after said moving said elevator down a first increment step, wherein said moving said elevator in a first direction step comprises moving said elevator down a second increment in response to a receipt of another said first signal based upon an existence of said second said container at said first vertical position.

11. A method, as claimed in claim 1, further comprising the steps of:

loading a first said container on said elevator at a first vertical position; and loading a second said container on said first said container and at a second vertical position which is greater than said first vertical position, wherein said moving said elevator in a first direction step comprises moving said elevator down a first increment in response to a receipt of one said first signal based upon an existence of said first said container at said first vertical position and which then disposes said second said container at said first vertical position, and wherein said moving said elevator in a first direction step further comprises moving said elevator down a second increment in response to a receipt of another said first signal based upon an existence of said second said container at said first vertical position.

12. A method, as claimed in claim 1, wherein:

a second said container is stacked on top of a first said container on said elevator, wherein said second said container is disposed at said second vertical position, wherein said method further is comprises the step of unloading said second said container from said elevator while said second said container is at said second vertical position, wherein said moving said elevator in a second direction step comprises moving said elevator such that said first said container is now disposed at said second vertical position in response to a receipt of said first signal by said elevator after said unloading step.

13. A method, as claimed in claim 1, further comprising the steps of:

loading said plurality of said containers on said elevator in stacked relation, one on top of another, wherein said moving said elevator in a first direction step comprises moving said elevator down one increment each time said executing a first monitoring step determines that one of said plurality of containers is still disposed at said first vertical position after a recentmost execution of said moving said elevator down one increment step; and unloading said plurality of containers, wherein said moving said elevator in a second direction step comprises moving said elevator up one increment each time said executing a second monitoring step determines that one of said plurality of said containers has been removed from said second vertical position.

14. A method for assembling a disk drive, comprising the steps of:

using a material delivery system at a workstation in a filtered environment wherein said material delivery system comprises:

an elevator comprising a platform, wherein said platform comprises a plurality of perforations, wherein a plurality of containers are stacked on said elevator for delivery to said workstation, wherein each said container comprises a plurality of disk drive components;

first means for monitoring for an existence of any said container on said elevator at a first vertical position, wherein said first means for monitoring is operatively interconnected with said elevator;

second means for monitoring for an absence of any said container on said elevator at a second vertical position, wherein said second means for monitoring is operatively interconnected with said elevator;

first means for moving said elevator in a first direction based upon a first output from said first means for monitoring that is provided to said elevator; and second means for moving said elevator in a second direction based upon a second output from said second means for monitoring that is provided to said elevator, wherein said second direction is at least generally opposite said first directions;

removing a first said disk drive component from an uppermost said container stacked on said elevator; and assembling at least part of a first disk drive using said first said disk drive component, wherein said assembling step is executed at said workstation.

15. A method, as claimed in claim 14, wherein:
said workstation is a clean room.
16. A method, as claimed in claim 14, wherein:
said workstation is a minienvironment.
17. A method, as claimed in claim 14, wherein;
said workstation has a cleanlinesss level of at least a class 100.
18. A method, as claimed in claim 14, wherein:
said first and second means for monitoring comprises first and second container sensors, respectively.
19. A method, as claimed in claim 18, wherein:
said first and second container sensors are directed at different, vertically spaced elevations.
20. A method, as claimed in claim 19, wherein said material delivery system further comprise:
a housing comprising an open upper end and a hollow interior, wherein said elevator is movably disposed within said hollow interior of said housing, and wherein each of said first and second container sensors are disposed any higher elevation than said open upper end of said lousing.
21. A method, as claimed in claim 14, wherein:
said fist vertical position is at a higher elevation than said second vertical position, wherein said first direction is at least generally vertically downward, and wherein said second direction is at least generally vertically upward.
22. A method, as claimed in claimed 14, wherein said material delivery system further comprises:
a housing comprising an open upper end and a hollow interior, wherein said elevator is movably disposed within said hollow interior; and
a support disposed at least generally proximate said open upper end, wherein said support comprises a plurality of perforations.
23. A method for assembling a disk drive comprising the steps of:
using a material delivery system at a workstation in a filtered environment, wherein said material delivery system comprises:

a housing comprising an open upper end and a hollow interior;

a support disposed at least generally proximate said open upper end, wherein said support comprises a plurality of perforations;

an elevator movably disposed within said hollow interior of said housing, wherein said elevator comprises a platform, wherein a plurality of containers are stacked on said elevator for delivery to said workstation, wherein each said container comprises a plurality of disk drive components;

an elevator drive assembly; and first and second container sensors that are operatively interconnected with said elevator drive assembly for initiating advancement of said elevator in opposite directions, wherein said first and second sensors are directed vertically beyond said upper end of said housing;

removing a first said disk drive component from an uppermost said container stacked on said elevator; and assembling at least part of a first disk drive using said first said disk drive component. wherein said assembling step is executed at said workstation.

24. A method, as claimed in claim 23, wherein:
said first and second container sensors are positioned vertically above said open upper end of said housing.
25. A method, as claimed in claim 24, wherein said material delivery system further comprises:
means for moving said elevator in response to an output from each of said first and second container sensors.
26. A method, as claimed in claim 25, wherein:
said means for moving comprises means for moving said elevator in an at least generally vertically downward direction in response to said first container sensor identifying a presence of any said container at a first vertical position, and wherein said means for moving further comprises means for moving said elevator in an at least generally vertically upward direction in response to said second container sensor identifying an absence of any said container at a second vertical position which is lower than said first vertical position.
27. A method, as claimed in claim 23, wherein said material delivers system further comprises:
means for automatically moving said elevator in response to an output from either of said first and second container sensors.
28. A method, as claimed in claim 23, wherein:
said platform comprises a plurality of perforations.
29. A method, as claimed in claim 23, wherein:
said first and second container sensors are mounted on said support.
30. A method for assembling a disk drive at a workstation, wherein said method comprises the steps of:
using a material delivery system at said workstation, wherein said material delivery system comprises:
a housing comprising an open upper end and a hollow interior;
a support disposed at least generally proximate said upper end, wherein said support comprises a plurality of perforations;
an elevator movably disposed within said hollow interior of said housing, wherein said elevator comprises a platform, wherein said platform comprises a plurality of perforations, wherein a plurality of containers are stacked on said elevator for delivery to said workstation, and wherein each said container comprises a plurality of disk drive components; and an elevator drive assembly;

providing a filtered environment at said workstation;

loading a plurality of containers in stacked relation on said elevator;

moving said elevator downward one increment during said loading step each time a first container sensor identifies an existence of any container at a first vertical position;

unloading said plurality of container at said work station;

moving said elevator upward one increment during said unloading step each time a second container sensor identifies an absence of any container at a second vertical position;

removing a first said disk drive component from an uppermost said container on said elevator; and assembling at least part of a first disk drive using said first said disk drive component, wherein said assembling step is executed at said workstation.

\* \* \* \* \*

UNITED STATES PATENT AND TRADEMARK OFFICE
CERTIFICATE OF CORRECTION

PATENT NO.    : 6,648,587 B1                                                Page 1 of 1
DATED         : November 18, 2003
INVENTOR(S)   : McMunigal et al.

It is certified that error appears in the above-identified patent and that said Letters Patent is hereby corrected as shown below:

Column 9,
Line 33, delete the word "assembly.which" and insert therefor -- assembly which --.

Column 10,
Line 51, delete the word " "clean"product", and insert therefor -- "clean" product --.

Column 12,
Line 24, delete the word "is.provided", and insert therefor -- is provided --.

Column 19,
Line 28, delete the word " "up"button", and insert therefor -- "up" button --.

Column 30,
Line 47, after the word "wherein", insert -- a --.

Column 32,
Line 27, delete the word "is".

Column 33,
Line 36, delete the word "comprise", and insert therefor -- comprises --;
Line 42, delete the word "lousing" and insert therefor -- housing --;
Line 44, delete the word "fist", and insert therefor -- first --.

Column 34,
Line 43, delete the word "delivers", and insert therefor -- delivery --.

Signed and Sealed this

Third Day of February, 2004

JON W. DUDAS
*Acting Director of the United States Patent and Trademark Office*